(12) United States Patent
Sakai

(10) Patent No.: US 7,867,334 B2
(45) Date of Patent: Jan. 11, 2011

(54) SILICON CASTING APPARATUS AND METHOD OF PRODUCING SILICON INGOT

(75) Inventor: Youhei Sakai, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 861 days.

(21) Appl. No.: 10/599,544

(22) PCT Filed: Mar. 29, 2005

(86) PCT No.: PCT/JP2005/006549

§ 371 (c)(1),
(2), (4) Date: May 23, 2007

(87) PCT Pub. No.: WO2005/092791

PCT Pub. Date: Oct. 6, 2005

(65) Prior Publication Data

US 2007/0227189 A1    Oct. 4, 2007

(30) Foreign Application Priority Data

Mar. 29, 2004    (JP) .............................. 2004-093936

(51) Int. Cl.
*C30B 15/20*    (2006.01)
(52) U.S. Cl. ..................... 117/18; 117/33; 117/214; 117/216; 117/924
(58) Field of Classification Search ............. 117/18, 117/33, 214, 216, 924
See application file for complete search history.

(56) References Cited

U.S. PATENT DOCUMENTS

| | | | |
|---|---|---|---|
| 3,561,931 A * | 2/1971 | Vogel et al. .................. 117/28 |
| 4,911,780 A * | 3/1990 | Morioka et al. ............... 117/18 |
| 6,027,563 A * | 2/2000 | Choudhury et al. ........... 117/18 |
| 6,136,091 A | 10/2000 | Yamazaki et al. ............. 117/81 |
| 6,383,285 B1 | 5/2002 | Wakita et al. ................. 117/11 |
| 2002/0139297 A1 | 10/2002 | Wakita et al. ............... 117/206 |

FOREIGN PATENT DOCUMENTS

| | | |
|---|---|---|
| JP | 63-166711 | 7/1988 |
| JP | 04-068276 | 10/1992 |
| JP | 09-071497 | 3/1997 |
| JP | 11-011924 | 1/1999 |
| JP | 2001-010810 | 1/2001 |
| JP | 2002-292458 | 10/2002 |
| JP | 2002-293526 | 10/2002 |

* cited by examiner

*Primary Examiner*—Tim Heitbrink
(74) *Attorney, Agent, or Firm*—DLA Piper LLP (US)

(57) ABSTRACT

A silicon casting apparatus for producing polycrystal silicon ingot by heating a silicon melt (8) held in a mold (4) from above by a heater (3) and cooling it from below while changing the heat exchange area of a heat exchange region (HE), defined between a pedestal (5) having the mold (4) placed thereon and a bottom cooling member (6), in such a manner as to keep pace with the rise of the solid-liquid interface of the silicon melt (8), thereby causing unidirectional solidification upward along the mold (4); and a method of producing polycrystal silicon ingot using such apparatus. According to this production method, the temperature gradient given to the silicon melt (8) can be maintained at constant by adjusting the heat exchange area, so that polycrystal silicon ingot having good characteristics can be produced with good reproducibility.

17 Claims, 13 Drawing Sheets

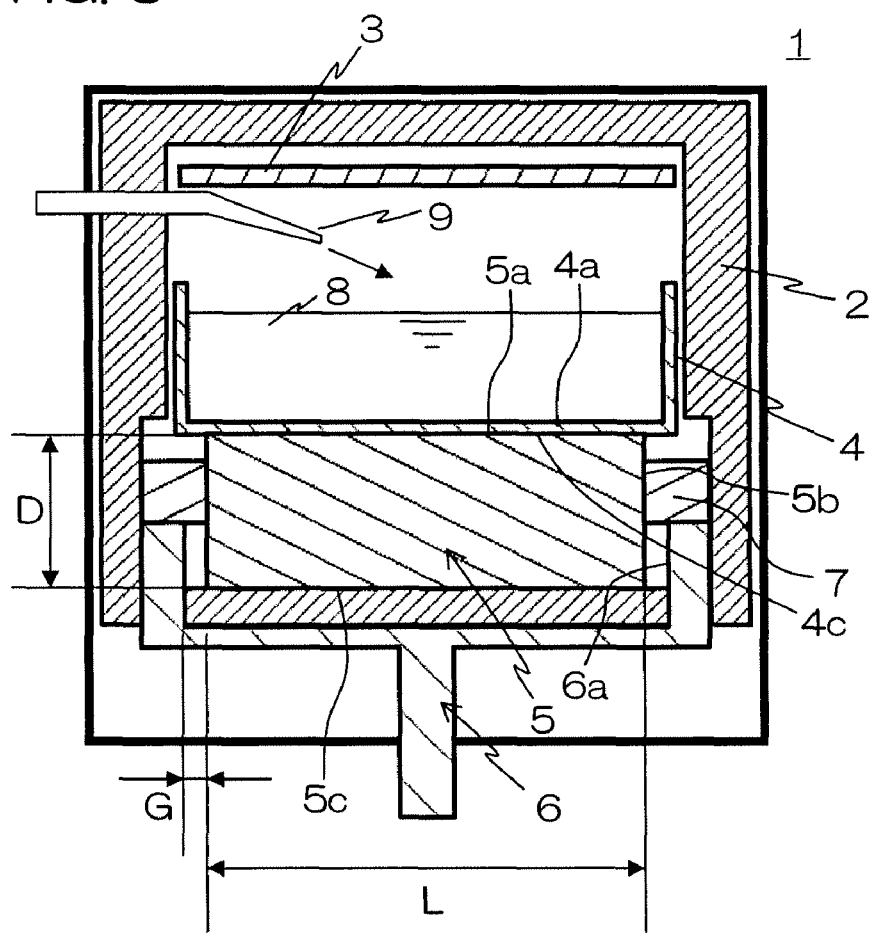

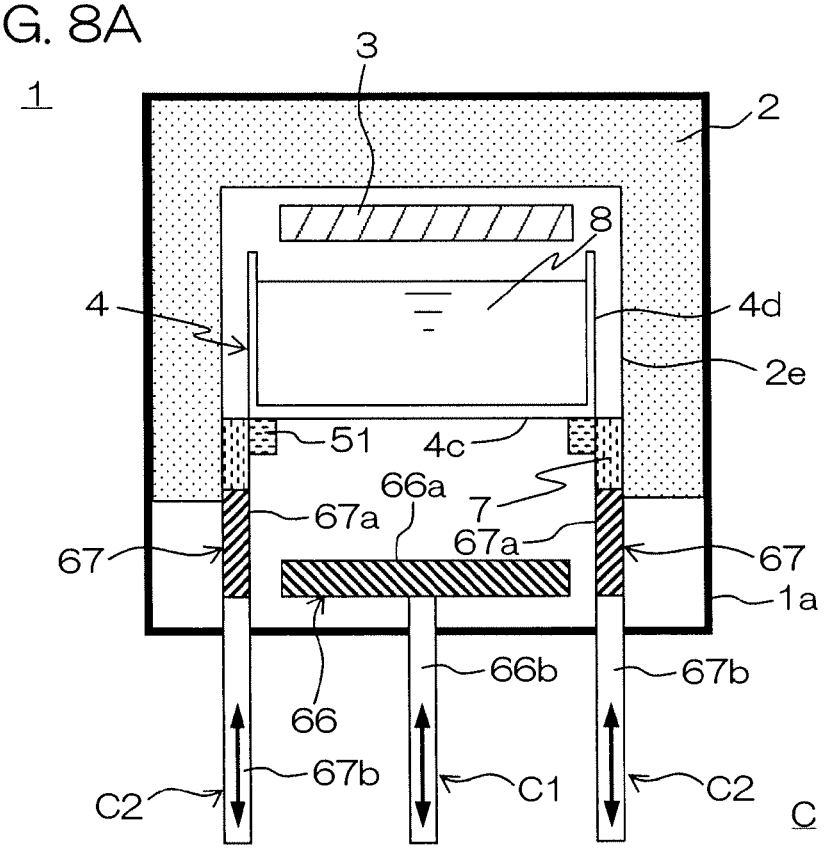
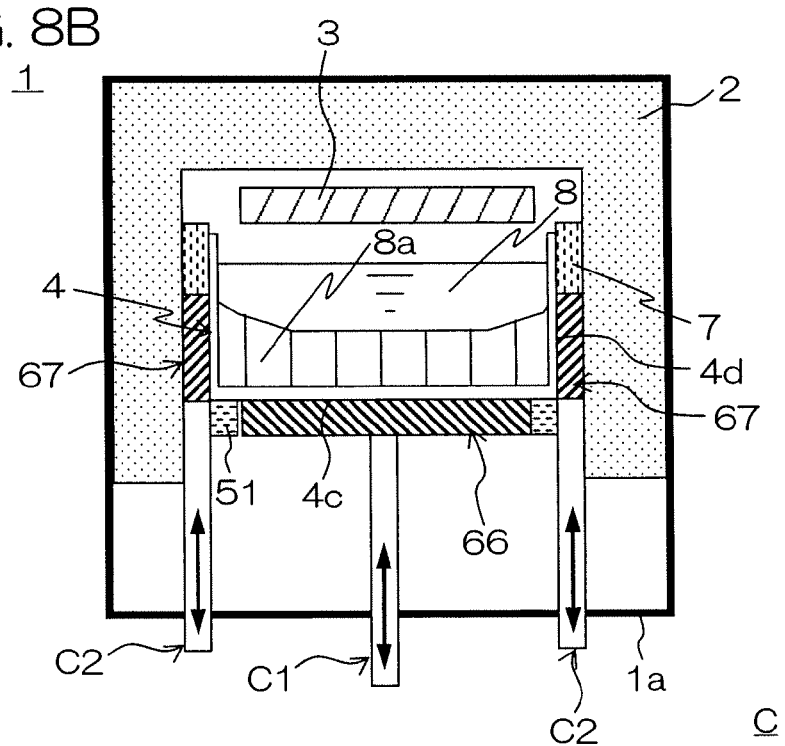

PRIOR ART

PRIOR ART

US 7,867,334 B2

SILICON CASTING APPARATUS AND METHOD OF PRODUCING SILICON INGOT

FIELD OF THE INVENTION

The present invention relates to a silicon casting apparatus for producing silicon ingot used for a silicon substrate for solar cell, for example, and a method of producing the silicon ingot.

BACKGROUND ART

According to PVNews in the U.S., the production of solar cell throughout the world in 2003 is 744 MW in terms of the total amount of generated power output, which increases by 12 times in the past ten years. The rapid increase of the production is due to rising concern about environmental problems, which is driven by crystal silicon solar cell occupying approximately 90% of the production of solar cell throughout the world and particularly, silicon solar cell occupying more than 60% of the production and using silicon ingot produced by a casting method, whose production is the highest today.

As the silicon solar cell, high-quality products being lower in cost and having higher conversion efficiency are required. Since the conversion efficiency and the production cost of the silicon solar cell greatly depend on silicon ingot to be used, important requirements are further quality increase and cost reduction of the silicon ingot.

The quality of the silicon ingot greatly depends on number (the area) of crystal grain boundaries, property of the grain boundaries, orientation property or defect density within the crystal grains, and so on, which constitute a factor for shortening carrier life time and carrier mobility in the solar cell to reduce the energy conversion efficiency of the solar cell. In order to improve the energy conversion efficiency of the solar cell using silicon, therefore, extensive research on the above-mentioned items and establishment of manufacturing technology are required.

The silicon ingot is generally produced by pouring a silicon melt obtained by heating and melting silicon into a mold or putting a silicon raw material in a mold, followed by heating, thereby melting the silicon raw material into a silicon melt, then cooling a bottom plate of the mold while keeping warm or heating an upper part of the mold, to give a positive temperature gradient upward from the bottom plate to the silicon melt within the mold, thereby subjecting the silicon melt to unidirectional solidification.

The silicon ingot thus obtained is processed into a silicon substrate for solar cell by generally cutting away the structure of a side surface portion and a bottom surface portion of the ingot having a large number of defects and impurities or a head of the ingot whose impurities are thickened by a solidification segregation phenomenon over a thickness of not less than several millimeters, and then slicing the ingot in the thickness direction using a multi-wire saw or the like.

FIGS. 12A and 12B are vertical sectional views showing an example of a conventional silicon casting apparatus for producing silicon ingot by the above-mentioned unidirectional solidification method disclosed in Japanese Examined Patent Publication JP04-068276B (1992).

Referring to both the figures, the silicon casting apparatus in this example comprises a furnace 21 whose bottom is opened by an opening 21a. A water-cooling chill plate 26, which can be raised and lowered, is disposed in a portion of the opening 21a of the furnace 21, and a cylindrical heat insulating body 27, which can be raised and lowered within the opening 21a, separately from the water-cooling chill plate 26 is provided in a gap between an outer peripheral edge of the water-cooling chill plate 26 and an inner peripheral surface of the opening 21a. There are provided, at an upper end of the heat insulating body 27, a mold 24 for holding a silicon melt 22 inside thereof which having a bottom plate 24a and a side plate 24b raised upward from a peripheral edge of the bottom plate 24a is disposed in a state where it can be raised and lowered together with the heat insulating body 27.

In order to produce silicon ingot using the above-mentioned silicon casting apparatus, the mold 24 having the silicon melt 22 held inside thereof is first arranged at its raised position within the furnace 21 heated to a predetermined temperature, as shown in FIG. 12A. In this case, the water-cooling chill plate 26 is lowered, and is spaced apart from a bottom surface of the mold 24.

As shown in FIG. 12B, the water-cooling chill plate 26 is then raised while being cooled with cooling water 25 passed therein, and is contact to the bottom surface of the mold 24, to cool the bottom plate 24a of the mold 24. When the mold 24, the water-cooling chill plate 26, and the heat insulating body 27 are gradually lowered, and are gradually pulled out of the furnace 21 through the opening 21a, a temperature gradient occurs in the silicon melt 22 within the mold 24 because the furnace 21 is heated to the predetermined temperature, as described above. Therefore, the silicon melt 22 is subjected to unidirectional solidification, so that silicon ingot is cast.

In the above-mentioned silicon casting apparatus, a solid-liquid interface of the silicon melt 22 exists in the vicinity of the bottom plate 24a of the mold 24, close to the water-cooling chill plate 26, in early stages of cooling, so that the solidification speed is high. As the solid-liquid interface rises by the progress of solidification, however, heat resistance caused by the thickness of a solid layer increases, so that the amount of heat removed by the water-cooling chill plate 26 decreases. As a result, the solidification speed tends to reduce. Therefore, the previous document discloses that the solidification speed is controlled by a combination of the speed at which the mold 24, the water-cooling chill plate 26, and the heat insulating body 27 are lowered and pulled out of the furnace 21 and the temperature at which the furnace 21 is heated.

In the above-mentioned silicon casting apparatus, however, the cooling capability of the water-cooling chill plate 26 is constant. Even if the speed at which the mold 24 is pulled out of the furnace 21 and the temperature at which the furnace 21 is heated are adjusted, as described above, therefore, it is difficult to subject silicon to crystal growth while keeping the temperature gradient stable within a predetermined range to solidify the silicon melt at a substantially constant speed from early stages of solidification to complete solidification. Therefore, there is a problem that the silicon ingot which has the substantially uniform in the thickness direction in the crystal grain diameter, the number of crystal grain boundaries, the property of the grain boundaries, the orientation property or the defect density within the crystal grains, and so on (it is the silicon ingot which can produce silicon substrates, which are equal in above-mentioned various kinds of characteristics, as many as possible by slicing in the thickness direction) cannot be produced with good reproducibility.

FIG. 13 is a vertical sectional view showing another example of a conventional silicon casting apparatus for producing silicon ingot by the above-mentioned unidirectional solidification method disclosed in Japanese Unexamined Patent Publication JP2002-293526A.

Referring to FIG. 13, the silicon casting apparatus in this example is so adapted that an upper chamber (furnace) 31 having a heater 34 serving as a heating mechanism and a lower chamber 32 having a cooling plate 41 cooled with cooling water 42 are defined by a barrier wall 33 composed of a heat insulating material and are connected to each other by a communication port 35 provided in the barrier wall 33, a mold 38 comprising a bottom plate 38a and a side plate 38b raised upward from a peripheral edge of the bottom plate 38a for holding a silicon melt 39 inside thereof is provided within the upper chamber 31 such that it can pass through the communication port 35 by being raised and lowered using an up-and-down machine 37.

A heat insulating material 40 for closing the communication port 35 as well as insulating between a stand 36 and the cooling plate 41 at a raised position shown in FIG. 13 and the stand 36 opposed to the cooling plate 41 for cooling (heat removing) by thermally connecting the mold 38 to the cooling plate 41 at a lowered position, which is not illustrated, are stacked in this order on the up-and-down machine 37, and the mold 38 is disposed thereon.

In order to produce silicon ingot using the above-mentioned silicon casting apparatus, the mold 38 having the silicon melt 39 held inside thereof is first arranged at a raised position within the upper chamber 31 heated to a predetermined temperature, as shown in FIG. 13.

The mold 38, the stand 36, and the heat insulating material 40 are then lowered by operating the up-and-down machine 37, to oppose the stand 36 and the cooling plate 41 to each other, thereby cooling the side of the bottom plate 38a of the mold 38. Consequently, a temperature gradient occurs in the silicon melt 39 within the mold 38 because the upper chamber 31 is heated to a predetermined temperature, as described above. Therefore, the silicon melt 39 is subjected to unidirectional solidification, so that silicon ingot is cast.

In the above-mentioned silicon casting apparatus, however, the mold 38 is lowered, as described above, at the time of cooling and solidification of the silicon melt 39 that influence the quality of the silicon ingot. Therefore, the distance between the mold 38 and the heater 34 and the amount of insertion of the mold 38 into the upper chamber 31 having the heater 34 vary, so that the entrance and exit of heat to and from the mold 38 easily vary. Particularly when the upper chamber 31 is brought into an atmosphere depressurized by inert gas such as Ar, a large part of heat from the heater 34 is transferred to the mold 38 by radiation. Thus, the distance therebetween is changed, so that the amount of heat from the heater 34 to the mold 38 greatly varies.

Even in the above-mentioned silicon casting apparatus, therefore, it is difficult to stably maintain the temperature gradient from early stages of solidification to complete solidification. Therefore, silicon ingot that is substantially uniform in the thickness direction in the crystal grain diameter, the number of crystal grain boundaries, the property of the grain boundaries, the orientation property or the defect density within the crystal grains, and so on cannot be produced with good reproducibility.

In recent years, in producing silicon ingot by the unidirectional solidification method, a unidirectional solidification and refinement method in which a nozzle is provided in a furnace, inert gas such as Ar is sprayed on a surface of a silicon melt through the nozzle, to induce agitation by heat convection in the silicon melt, and metal impurities having a low distribution coefficient are refined toward the top of an ingot while restraining thickening of the metal impurities in a solid-liquid interface, to reduce the amount of impurity elements inside of the ingot has been carried out, as described in Japanese Unexamined Patent Publication JP09-71497A (1997).

In a case where the mold is raised and lowered to and from the furnace, as in the above two examples, however, the distance between a liquid surface of the silicon melt within the mold and a front end of the nozzle is changed, and a state where inert gas stays varies. Therefore, the unidirectional solidification and refinement method, described above, cannot be smoothly and uniformly carried out.

Japanese Unexamined Patent Publication JP09-71497A (1997) discloses a silicon casting apparatus so adapted that a bottom plate of a mold is cooled through a pedestal on which the mold is placed by cooling with cooling water in a state where the pedestal is fixed to a heating furnace. The above document discloses that a temperature gradient from early stages of solidification to complete solidification can be stably maintained by restraining the amount of cooling water supplied to the pedestal in early stages of solidification of a silicon melt to restrain the amount of heat removed from the mold, and gradually increasing the amount of cooling water with the progress of solidification to increase the amount of heat removed from the mold.

However, the effect of adjusting the amount of heat removed, which is brought about by the change in the amount of cooling water, is not sufficient. According to examination made by the inventors, the amount of heat removed from the mold at a high temperature is proportional to a temperature difference between the mold and a cooling mechanism and the area in which heat exchange is carried out (the heat exchange area) and particularly, more greatly depends on the latter heat exchange area. In the above document, however, the temperature difference between the mold and the cooling mechanism is only changed by increasing and decreasing the amount of cooling water, so that the area in which heat exchange is carried out is constant. Moreover, the amount of temperature change in the cooling mechanism, which is brought about by the change in the amount of cooling water, is merely a very small change, as compared with the temperature of the silicon melt at a high temperature of not less than 1414° C.

Even if the silicon casting apparatus disclosed in the above document is used, therefore, the amount of heat removed cannot be sufficiently controlled. Therefore, it is difficult to stably maintain the temperature gradient from early stages of solidification to complete solidification, so that silicon ingot that is substantially uniform in the thickness direction in the crystal grain diameter, the number of crystal grain boundaries, the property of the grain boundaries, the orientation property or the defect density within the crystal grains, and so on cannot be produced with good reproducibility.

SUMMARY OF THE INVENTION

An object of the present invention is to provide a silicon casting apparatus capable of producing higher-quality silicon ingot with good reproducibility and at as low cost as possible, and a method of producing the silicon ingot.

A silicon casting apparatus according to the present invention for attaining the foregoing object comprising:

a mold for holding a silicon melt therein and cooling and solidifying the silicon melt to produce silicon ingot;

a heating mechanism for heating the silicon melt and disposed with a distance from the mold kept constant above the mold; and a cooling mechanism disposed below the heating mechanism for cooling the silicon melt, characterized in that the cooling mechanism comprises a cooling member for cooling an outer surface of the mold, the cooling member having a heat receiving surface brought into direct contact with a heat radiation surface that is (i) the outer surface of the mold, or (ii) a surface, other than a contact surface with which the outer surface of the mold is brought into contact, of a heat transfer member comprising the contact surface, or arranged in close proximity thereto with a predetermined gap, and is moved relative to the mold or the pedestal in order to change the heat exchange area, brought into contact with or arranged in close proximity to the heat radiation surface, of the heat receiving surface.

In the present invention, the mold and the heating mechanism are disposed with the distance therebetween kept constant, so that the variation in the amount of heat from the heating mechanism to the mold, caused by the variation in the distance, can be restrained. The heat exchange area, brought into contact with or arranged in close proximity to the heat radiation surface provided on the outer surface or the like of the mold, of the heat receiving surface provided in the cooling member in the cooling mechanism, is changed by moving the cooling member relative to the mold or the like, so that the amount of heat removed from the mold by the cooling mechanism can be also sufficiently satisfactorily controlled. According to the present invention, therefore, silicon can be subjected to crystal growth while solidifying the silicon melt at a substantially constant speed with the temperature gradient kept stable within a predetermined range from early stages of solidification to complete solidification, so that higher-quality silicon ingot that is substantially uniform in the thickness direction in the crystal grain diameter, the number of crystal grain boundaries, the property of the grain boundaries, the orientation property or the defect density within the crystal grains, and so on can be produced with good reproducibility and at as low cost as possible.

The distance between the mold and the heating mechanism may be kept constant during at least the process of producing silicon ingot. In other processes such as a process where a silicon raw material is accommodated within the mold and a process where the produced silicon ingot is taken out of the mold, either one of the mold and the heating mechanism may be moved to increase the distance therebetween, the mold may be taken out of the apparatus, or the heating mechanism may be removed, for example, in order to improve the workability.

It is preferable that the cooling member comprises a bottom cooling member for cooling a bottom surface of the mold, the bottom cooling member having a heat receiving surface brought into direct contact with a heat radiation surface that is (1) the bottom surface of the mold, or (2) a surface, other than a placement surface serving as a contact surface, on which the mold is placed with the bottom surface of the mold being in contact therewith, of a pedestal serving as a heat transfer member comprising the placement surface, or arranged in close proximity thereto with a predetermined gap, and is moved relative to the mold or the pedestal in order to change the heat exchange area, brought into contact with or arranged in close proximity to the heat radiation surface, of the heat receiving surface.

An example of the bottom cooling member is one moved in a plane direction of the heat radiation surface relative to the mold or the pedestal while maintaining a state where the heat receiving surface thereof is kept in direct contact with the heat radiation surface in order to change the heat exchange area.

In the bottom cooling member, the heat receiving surface thereof is kept in direct contact with the heat radiation surface of the mold or the like, so that heat exchange efficiency is high, and the amount of heat removed can be quickly changed with good responsiveness when the bottom cooling member is moved relative to the mold or the like to change the heat exchange area.

An example of the bottom cooling member is one moved in a plane direction of the heat radiation surface relative to the mold or the pedestal while maintaining a state where the heat receiving surface thereof is arranged in close proximity to the heat radiation surface with a predetermined gap in order to change the heat exchange area.

In the bottom cooling member, heat exchange is carried out while the bottom cooling member is relatively moved in a state where there is no sliding surface by maintaining a state where the heat receiving surface of the bottom cooling member is not brought into direct contact with and is spaced a predetermined gap apart from the heat radiation surface of the mold or the like, which can prevent mechanical wear of both the surfaces.

In the bottom cooling member, heat exchange is carried out by radiation and convection of heat between the heat radiation surface and the heat receiving surface. In order to carry out the heat exchange more efficiently, therefore, it is preferable that the gap between the heat radiation surface and the heat receiving surface is not more than 10 mm.

When the heat radiation surface is a surface, other than the placement surface on which the mold is placed, of the pedestal, it is preferable that the thermal conductivity of the pedestal is not less than 40 W/(m·K) in order to remove heat by the bottom cooling member from the mold through the pedestal more efficiently.

It is preferable that the pedestal is thick in a range in which heat exchange between the mold and the bottom cooling member is not prevented, in order to reduce a temperature distribution on the side of the bottom surface of the mold and improve unidirectional solidification properties of the silicon melt. That is, it is preferable that the pedestal has one surface serving as the placement surface, a surface opposite to the placement surface being parallel to the placement surface, and is formed in the shape of a plate having a constant thickness, and the thickness is not less than one-sixth of a stretch length of a contact region between the placement surface and the bottom surface of the mold placed on the placement surface.

In the silicon casting apparatus according to the present invention, it is preferable that the mold comprises a bottom plate and a side plate raised upward from a peripheral edge of the bottom plate, and the cooling member comprises a bottom cooling member for cooling a bottom surface that is a lower surface of the bottom plate of the mold, and a side cooling member for cooling a side surface that is an outer side surface of the side plate of the mold, the side cooling member having a heat receiving surface brought into direct contact with the side surface of the mold or arranged in close proximity thereto with a predetermined gap, and being moved relative to the mold in order to change the heat exchange area, brought into contact with or arranged in close proximity to the side surface of the mold, of the heat receiving surface.

According to this configuration, the heat exchange area between the heat receiving surface provided on the side cooling member and the side surface of the mold serving as the heat radiation surface can be changed so as to be enlarged from the lower part to the upper part in order in the height direction of the mold as a solid-liquid interface rises by the progress of solidification of the silicon melt within the mold, for example, by moving the side cooling member relative to the mold while cooling the bottom surface of the mold by the bottom cooling member. Therefore, the amount of heat removed from the mold by the cooling mechanism can be sufficiently satisfactorily controlled, and the temperature gradient can be stably maintained from early stages of solidification to complete solidification, so that higher-quality silicon ingot that is substantially uniform in the thickness direction in the crystal grain diameter, the number of crystal grain boundaries, the property of the grain boundaries, the orientation property or the defect density within the crystal grains, and so on can be produced with good reproducibility and at as low cost as possible.

An example of the side cooling member is one moved in a height direction of the mold relative to the mold while maintaining a state where the heat receiving surface is kept in direct contact with the side surface of the mold in order to change the heat exchange area on the side surface of the mold.

In the side cooling member, the heat receiving surface thereof is kept in direct contact with the side surface, serving as the heat radiation surface, of the mold, so that heat exchange efficiency is high, and the amount of heat removed can be quickly changed with good responsiveness when the side cooling member is moved relative to the mold to change the heat exchange area.

An example of the side cooling member is one comprising a plurality of cooling members respectively having divisional heat receiving surfaces into which the heat receiving surface is divided in the height direction of the mold, each of the cooling members being relatively moved individually between a state where the divisional heat receiving surface is in direct contact with the side surface of the mold or arranged in close proximity thereto with a predetermined gap and a state where they are spaced apart from each other.

In the side cooling member, heat exchange is carried out by individually moving the divisional heat receiving surface of each of the cooling sections, without sliding relative to the side surface of the mold, between a state where they are contact to or brought near each other and a state where they are spaced apart from each other. Therefore, there is no sliding surface, which can prevent mechanical wear of each of the surfaces. Particularly when the divisional heat receiving surface is directly contact to the side surface of the mold, heat exchange efficiency can be improved, and the amount of heat removed can be quickly changed with good responsiveness when the side cooling member is moved relative to the mold to change the heat exchange area.

An example of the bottom cooling member that is combined with the side cooling member is one having a heat receiving surface brought into direct contact with a heat radiation surface that is (1) the bottom surface of the mold, or (2) a surface, other than a placement surface on which the mold is placed, of the pedestal comprising the placement surface with the bottom surface of the mold being in direct contact therewith or arranged in close proximity thereto with a predetermined gap, and is moved relative to the mold or the pedestal in order to change the heat exchange area, brought into contact with or arranged in close proximity to the heat radiation surface, of the heat receiving surface.

If the bottom cooling member is combined with the side cooling member, the temperature gradient from early stages of solidification to complete solidification can be more stably maintained, so that higher-quality silicon ingot can be produced with good reproducibility and at as low cost as possible.

An example of the bottom cooling member is one comprising a plurality of cooling members respectively having divisional heat receiving surfaces into which the heat receiving surface is divided at a center and a peripheral edge of the bottom surface of the mold, each of the cooling members being relatively moved individually between a state where the divisional heat receiving surface is in direct contact with the heat radiation surface or arranged in close proximity thereto with a predetermined gap and a state where they are spaced apart from each other.

If the bottom cooling member is combined with the side cooling member, the temperature gradient is more finely controlled in conformity with the solidification of the silicon melt within the mold, so that higher-quality silicon ingot can be produced with good reproducibility and at as low cost as possible.

It is preferable that the silicon casting apparatus according to the present invention comprises temperature detection unit for measuring a temperature of the mold, and control unit for controlling a state of heating by the heating mechanism and a position of the cooling member relative to the mold on the basis of the temperature of the mold measured by the temperature detection unit, considering that the temperature gradient from early stages of solidification to complete solidification is more stably maintained to produce higher-quality silicon ingot with good reproducibility.

Further, it is preferable that the silicon casting apparatus according to the present invention comprises inert gas discharge unit, with a distance from the mold and the heating mechanism kept constant, for spraying inert gas on the silicon melt held inside the mold, in order to solidify the silicon melt smoothly and uniformly and produce silicon ingot. The distance from the inert gas discharge unit to the mold and the heating mechanism may be kept constant during at least the process of producing silicon ingot.

A method of producing silicon ingot according to the present invention using the silicon casting apparatus according to the present invention, characterized by comprising the steps of: holding a silicon melt inside a mold; and subjecting the silicon melt to unidirectional solidification from a lower part to an upper part of the mold by cooling the silicon melt from below of the mold by a cooling mechanism while heating the silicon melt by a heating mechanism disposed above the mold with a predetermined distance maintained therebetween as well as moving the cooling mechanism relative to the mold as a solid-liquid interface of the silicon melt rises due to cooling.

According to the present invention, the amount of heat removed can be sufficiently controlled, as previously described. Therefore, the temperature gradient is stably maintained from early stages of solidification to complete solidification, so that silicon ingot that is substantially uniform in the thickness direction in the crystal grain diameter, the number of crystal grain boundaries, the property of the grain boundaries, the orientation property or the defect density within the crystal grains, and so on can be produced with good reproducibility and at low cost.

Further, in the producing method according to the present invention, when the silicon casting apparatus comprises temperature detection unit and control unit, the control unit subjecting the silicon melt to unidirectional solidification from a lower part to an upper part of the mold while controlling a state of heating by the heating mechanism and a position of the cooling member relative to the mold on the basis of a temperature of the mold measured by the temperature detection unit, higher-quality silicon ingot can be produced with good reproducibility and at low cost since the temperature gradient is maintained more stably from early stages of solidification to complete solidification.

Further, in the producing method according to the present invention, when the silicon casting apparatus comprises inert gas discharge unit, for subjecting the silicon melt held inside the mold to unidirectional solidification from a lower part to an upper part of the mold while spraying inert gas from the inert gas discharge unit on the silicon melt, the silicon melt can be solidified smoothly and uniformly. Therefore, the amount of impurity elements is significantly reduced, so that higher-quality silicon ingot can be produced with good reproducibility and at low cost.

BRIEF DESCRIPTION OF DRAWINGS

FIG. 3 is a vertical sectional view showing another embodiment in which inert gas discharge unit is combined with the silicon casting apparatus according to the present invention.

FIG. 8A is a vertical sectional view showing another embodiment of the silicon casting apparatus according to the present invention, and FIG. 8B is a vertical sectional view showing a state where a bottom cooling member and a side cooling member in the silicon casting apparatus in the above embodiment are relatively moved.

DETAILED DESCRIPTION OF THE BEST MODE OF THE INVENTION

Figure 1A:
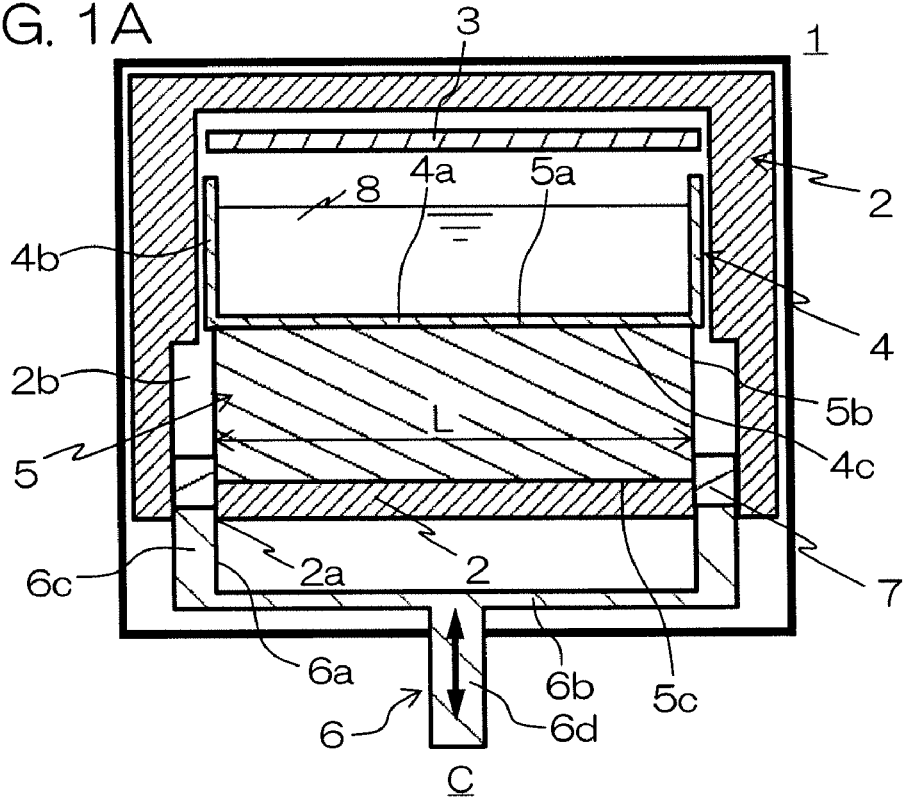
FIG. 1A is a vertical sectional view showing an embodiment of a silicon casting apparatus according to the present invention.
Figure 1B:
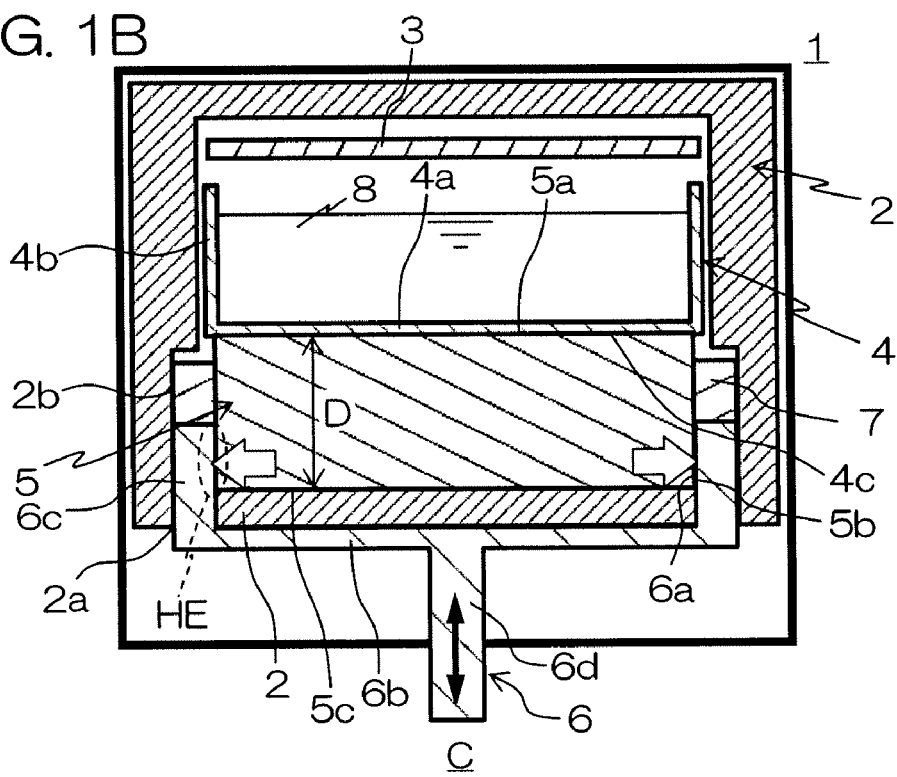
FIG. 1B is a vertical sectional view showing a state where a bottom cooling member in the silicon casting apparatus in the above example is relatively moved.

FIG. 1A is a vertical sectional view showing an embodiment of a silicon casting apparatus 1 according to the present invention, and FIG. 1B is a vertical sectional view showing a state where a bottom cooling member 6 in the silicon casting apparatus 1 in the above embodiment is relatively moved.

Referring to the figures, the silicon casting apparatus 1 in this example comprises
a mold 4 for holding a silicon melt 8 therein, comprising a bottom plate 4a and a side plate 4b raised upward from a peripheral edge of the bottom plate 4a,
a heater 3 serving as a heating mechanism disposed above the mold 4,
a pedestal 5 on which the mold 4 is placed with a bottom surface 4c that is a lower surface of the bottom plate 4a brought into contact with a placement surface 5a,
a heat insulating member 2 disposed so as to surround these members, and
a cooling mechanism C including a bottom cooling member 6 for cooling the bottom surface 4c of the mold 4 placed on the pedestal 5 by heat exchange thereof with the pedestal 5.

The heater 3 and the mold 4 out of these members are held with the distance therebetween kept constant during at least the process of producing silicon ingot by unidirectional solidification. In other processes such as a process where a silicon raw material is accommodated within the mold and a process where the produced silicon ingot is taken out of the mold, it is preferable that either one of the heater 3 and the mold 4 can be moved to increase the distance therebetween, the mold can be taken out of the apparatus, or the heating mechanism can be removed, in order to improve the workability.

It is preferable that the mold 4 is composed of silicon dioxide ($SiO_2$), graphite, a carbon fiber-reinforced carbon material, etc., which are not particularly limited, and is configured as a split mold that can be divided in taking out the produced silicon ingot and can be assembled again after being taken out. Further, it is preferable that a mold release layer, which is not illustrated, is provided on an inner surface of the mold 4 in order to prevent the silicon ingot from being fused to make it easy to take out the silicon ingot, whereby making it possible to reuse the mold 4 many times.

Examples of the mold release layer include layers of silicon compounds such as silicon nitride ($Si_3N_4$) as a nitride of silicon, silicon carbide (SiC) as a carbide of silicon, and silicon dioxide ($SiO_2$) as an oxide of silicon. In order to form the mold release layer on the inner surface of the mold 4, a powder of the silicon compound, together with a suitable binder, may be mixed with a solvent to form a slurry, and the slurry may be applied or sprayed, for example, to coat the inner surface of the mold 4.

Usable as the heater 3 are various types of heaters capable of heating and melting a silicon raw material accommodated within the mold 4 to form the silicon melt 8, and heating the produced silicon melt 8 from above the mold 4 and causing a temperature gradient in the silicon melt 8 in combination with cooling from the bottom surface 4c of the mold 4 by the cooling mechanism C to subject the silicon melt 8 to unidirectional solidification. Examples of the heater 3 having these functions include a heater of a resistive heating type in a doughnut shape or the like and a coil of an induction heating type. The heater 3 may be provided in not only a ceiling portion within a furnace as illustrated but also both a side surface portion and the ceiling portion within the furnace so as to surround the mold 4, which is not illustrated.

It is preferable that the pedestal 5 is formed of a material having a high thermal conductivity and being able to withstand high temperatures of not less than the melting point of silicon (1414° C.) and particularly not less than 1600° C. in an atmosphere of inert gas such as Ar, and particularly a material having a thermal conductivity of not less than 40 W/(m·K) and having high heat resistance, because it is used for heat removing from the bottom surface 4c of the mold 4 and transferring the heat to the bottom cooling member 6.

Examples of a material suited to form the pedestal 5 satisfying these conditions include graphite [a thermal conductivity of 49 W/(m·K)], sapphire [a thermal conductivity of 45 W(m·K)], aluminum nitride [AlN, a thermal conductivity of 84 W/(m·K)], and silicon carbide [SiC, a thermal conductivity of 200 W(m·K)]. Among them, graphite is preferable because it is easily processed and is low in cost.

The heat insulating member 2 is disposed so as to surround the mold 4, the heater 3, and the pedestal 5, as previously described. It is preferable that the heat insulating member 2 is formed of a material containing carbon as its main component, such as graphite felt, in consideration of heat resistance, heat insulation, and so on. The provision of the heat insulating member 2 allows radiation of heat from the heater 3 to be transferred to the silicon melt 8 within the mold 4 with few losses. Further, the silicon melt can be efficiently subjected to unidirectional solidification by restraining excessive removal of heat from the side plate 4b of the mold 4 and a lower surface 5c of the pedestal 5 to effectively heat remove only by the bottom cooling member 6 in the cooling mechanism C.

The heat insulating member 2 on the side of the lower surface 5c of the pedestal 5 is provided with an opening 2a for inserting a side plate 6c having a heat receiving surface 6a, described later, of the bottom cooling member 6, and a gap 2b provided between a side surface 5b of the pedestal 5 and the heat insulating member 2 for receiving the inserted side plate 6c is adjacent to the opening 2a.

The cooling mechanism C comprises: the above-mentioned bottom cooling member 6 comprising a heat receiving surface 6a which is brought into direct contact with the side surface 5b of the pedestal 5 serving as a heat radiation surface and extending downward from a peripheral edge of a placement surface 5a, the bottom cooling member 6 being moved in a plane direction of the side surface 5b relative to the pedestal 5 while maintaining a state where the heat receiving surface 6a is kept in contact with the side surface 5b, as indicated by a solid arrow in the figures; and an up-and-down motor (reference numeral 12 in FIG. 2) for relatively moving the bottom cooling member 6 in the above-mentioned plane direction.

Further, the bottom cooling member 6 is configured by integrally forming a bottom plate 6b in a flat plate shape disposed parallel to the lower surface 5c of the pedestal 5 below the pedestal 5, a side plate 6c raised upward from a peripheral edge of the bottom plate 6b and having an inner side surface serving as the heat receiving surface 6a, and a connection 6d extended downward from the center of a lower surface of the bottom plate 6b to connect with the up-and-down motor 12, using a metal material such as stainless steel, for example.

It is preferable that the side plate 6c out of the above-mentioned members is formed into a shape surrounding the side surface 5b of the pedestal 5. In a case where the pedestal 5 is in the shape of a rectangular parallelepiped, for example, the side plate 6c may be formed in the shape of a plate having four faces respectively conforming to four side surfaces 5b of the rectangular parallelepiped and being continuous with or independent of one another. In a case where the pedestal 5 is in the shape of a circular cylinder, the side plate 6c may be formed in the shape of a cylinder conforming to a side surface 5b of the circular cylinder, or in such a shape that a cylinder is divided into a plurality of parts in the circumferential direction, or the like. In the above-mentioned combination, it is desirable that the thickness of the pedestal 5 is as large as possible in a range in which heat exchange between the mold 4 and the bottom cooling member 6 is not prevented, considering that a temperature distribution on the placement surface 5a is made as uniform as possible to uniformly cool the bottom surface 4c of the mold 4.

A movable heat insulating piece 7 for closing the opening 2a is mounted so as to be capable of being raised or lowered with the bottom cooling member 6 on an upper end of the side plate 6C in a state where the bottom cooling member 6 is lowered to pull the side plate 6c out of the opening 2a of the heat insulating member 2, as shown in FIG. 1A. The movable heat insulating piece 7 is formed of the same heat insulating material as that forming the heat insulating member 2.

Piping, which is not illustrated, for circulating a cooling liquid such as water may be provided inside of the bottom cooling member 6 to cool the bottom cooling member 6 by circulation of the cooling liquid. As the cooling liquid, a liquid cooled by a heat exchanger outside of the silicon casting apparatus 1 may be circulated within the piping inside of the bottom cooling member 6 and then refluxed to the heat exchanger again.

The bottom cooling member 6 is moved relative to the pedestal 5 in a plane direction of the side surface 5b serving as the heat radiation surface by being raised and lowered using the up-and-down motor 12, as previously described. Consequently, the area of a region HE where the side surface 5b and the heat receiving surface 6a are brought into direct contact with each other in order to carry out heat exchange (shown in FIG. 1B, which is sometimes hereinafter referred to as a "heat exchange region"), i.e., the heat exchange area is changed.

For example, FIG. 1A illustrates a state where the bottom cooling member 6 is lowered to its lowermost part. In this state, the side surface 5b of the pedestal 5 and the heat receiving surface 6a of the bottom cooling member 6 are not at all in contact with each other, so that the heat exchange area of the heat exchange region HE is zero. In the illustrated state, the opening 2a in the heat insulating member 2 is closed by the movable heat insulating piece 7, as previously described. Particularly in cases where the cooling mechanism C is not utilized, such as a case where the silicon raw material is melted to form the silicon melt 8, therefore, heat can be effectively prevented from leaking out of the apparatus from the pedestal 5 and the like having a high thermal conductivity, so that time and cost required to produce silicon ingot can be saved.

Further, FIG. 1B illustrates a state where the bottom cooling member 6 is raised to its uppermost part. In this state, the side surface 5b of the pedestal 5 and the heat receiving surface 6a of the bottom cooling member 6 are brought into contact with each other over the widest area set by the apparatus in the illustrated embodiment, so that the heat exchange area of the heat exchange region HE reaches its maximum. Further, if the bottom cooling member 6 is moved to an arbitrary position between FIGS. 1A and 1B, which is not illustrated, the heat exchange area of the heat exchange region HE can be set in a stepless manner to an arbitrary region between zero and the maximum.

According to the silicon casting apparatus 1 in the illustrated embodiment, therefore, the amount of movement of heat removed by the bottom cooling member 6 through the heat exchange region HE (indicated by hollow arrows in FIG. 1B) via the pedestal 5 from the bottom surface 4c that is the lower surface of the bottom plate 4a of the mold 4, that is, the amount of heat removed can be gradually increased by gradually raising the bottom cooling member 6 to gradually increase the heat exchange area of the heat exchange region HE as a solid-liquid interface rises by the progress of solidification of the silicon melt 8, starting in the state shown in FIG. 1A.

Consequently, the temperature gradient given to the silicon melt 8 within the mold 4 by the heater 3 and the cooling mechanism C can be stably maintained from early stages of solidification to complete solidification irrespective of the increase in heat resistance caused by the rise in the solid-liquid interface, so that high-quality silicon ingot that is substantially uniform in the thickness direction in the crystal grain diameter, the number of crystal grain boundaries, the property of the grain boundaries, the orientation property or the defect density within crystal grains, and so on can be produced with good reproducibility and at low cost.

When the thickness D (see FIG. 1B) of the pedestal 5 is too small, there may occur a state where only the vicinity of the side surface 5b is cooled intensively and the center thereof is not sufficiently cooled. In order to make a temperature distribution on the side of the bottom plate 4a of the mold 4 as uniform as possible to improve unidirectional solidification properties of the silicon melt 8, therefore, it is desirable that the thickness D of the pedestal 5 is as large as possible. Although the specific range of the thickness D is not particularly limited, it is preferable that the thickness D is not less than one-sixth of the stretch length L (see FIG. 1A) of a contact region between the placement surface 5a and the bottom surface 4c of the mold 4 placed thereon. In order to prevent the pedestal 5 from being so thick as to prevent heat exchange between the mold 4 and the bottom cooling member 6, it is preferable that the thickness D is particularly not more than two-thirds of the stretch length L even in the above range.

The stretch length L herein referred to indicates one, having the smallest length, of line segments formed by cutting away a straight line passing through a center of gravity of the planar shape of the contact region between the placement surface 5a and the bottom surface 4c of the mold 4 placed thereon through a contour line of the planar shape. For example, when the planar shape of the contact region is the rectangular shape, the stretch length L coincides with the length of the short side of the rectangle. When the planar shape of the contact region is the shape of a circle, the stretch length L coincides with the diameter of the circle. The planar shape of the contact region coincides with the planar shape of the placement surface 5a when the placement surface 5a of the pedestal 5 is smaller than the bottom surface 4c of the mold 4, as in the example shown in FIGS. 1A and 1B, while coinciding with the planar shape of the bottom surface 4c of the mold 4 when the placement surface 5a is larger than the bottom surface 4c, as in an example shown in FIG. 11A.

Figure 2:
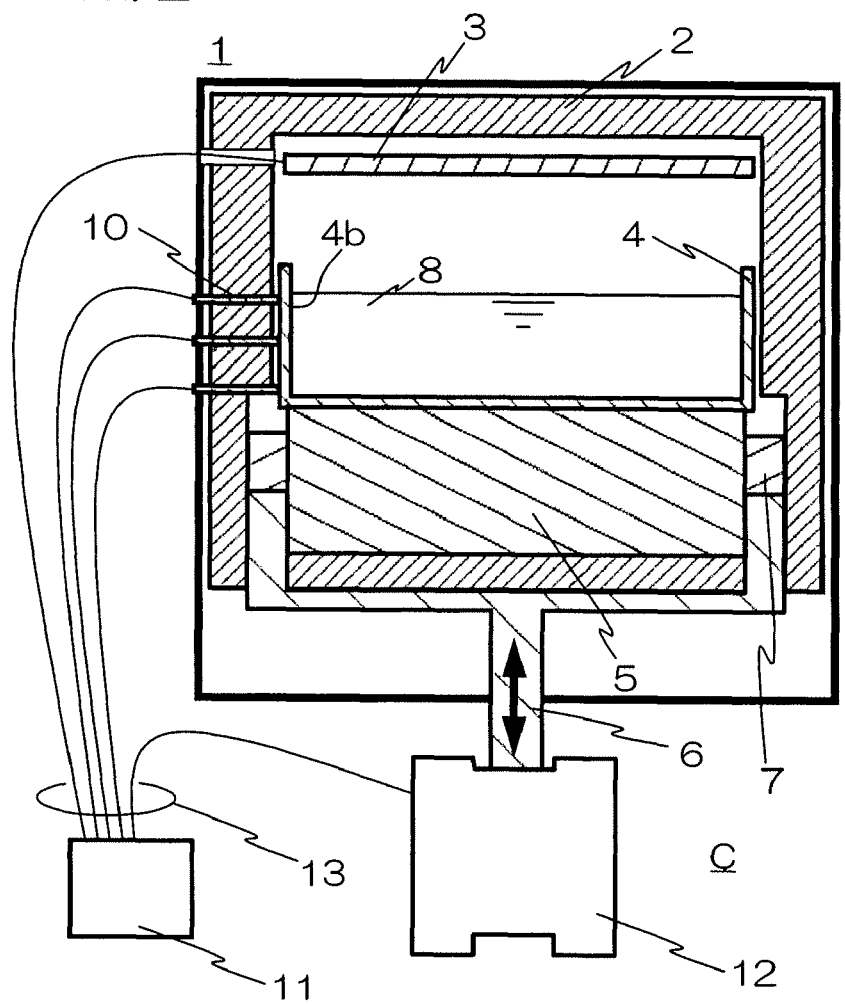
FIG. 2 is a vertical sectional view showing another embodiment in which temperature detection unit and control unit are combined with the silicon casting apparatus shown in FIGS. 1A and 1B.

FIG. 2 is a vertical sectional view showing another embodiment in which a thermocouple 10 serving as temperature detection unit and control unit 11 are combined with the silicon casting apparatus 1 shown in FIGS. 1A and 1B. Since the configuration of the other members have been previously described, only the difference will be described.

Referring to FIG. 2, thermocouples 10 are respectively provided at three points, i.e., the vicinity of the upper side of the side plate 4b of the mold 4, the vicinity of the lower side thereof, and a point intermediate therebetween. This allows the temperature gradient given to the silicon melt 8 within the mold 4 to be found. An output of each of the thermocouples 10 is fed to the control unit 11 through a control cable 13. The control unit 11 calculates the temperature gradient given to the silicon melt 8 from the outputs of the three thermocouples 10, and controls the driving of the heater 3 and the up-and-down motor 12 through the control cable 13 on the basis of the results of the calculation.

The temperature detection unit is not limited to the thermocouple 10. For example, a non-contact infrared thermometer or the like can be also used. Usable as the control unit 11 is a well-known programmable controller, for example. The programmable controller (sequencer) is very well-known in the field of mechanical control, and can be configured by unitizing a combination of modules each having a single function or using one module whose function is specialized. In the case of the above-mentioned control unit 11, the output from the thermocouple 10 is accepted as an analog voltage value, for example, so that a module for converting the analog voltage value into digital data, for example, may be suitably combined in use.

The procedure for producing silicon ingot using the above-mentioned silicon casting apparatus 1 will be described while referring to FIGS. 1A to 2.

First, when the mold 4 is filled with a silicon raw material to start the control unit 11, the control unit 11 lowers the bottom cooling member 6 in the cooling mechanism C to its lowermost position to close the opening 2a of the heat insulating member 2 by the movable heat insulating piece 7 so that the heater 3, the mold 4, and the pedestal 5 are surrounded by the heat insulating member 2 and the movable heat insulating piece 7, as shown in FIG. 1A. Then, the heater 3 is energized to heat the mold 4 to temperatures of approximately 1420° C. to 1550° C., thereby melting the silicon raw material. This can prevent radiant heat from the heater 3 from being lost, to melt effectively the silicon raw material in a shorter time period.

When the silicon raw material is melted to form the silicon melt 8, the control unit 11 drives the up-and-down motor 12 while monitoring the temperature gradient in the silicon melt 8 from the outputs of the three thermocouples 10, to gradually raise the bottom cooling member 6, which causes the heat exchange region HE to create between the bottom cooling member 6 and the pedestal 5 to start removal of heat.

The rise and fall of the bottom cooling member 6 and the corresponding increase and decrease in the heat exchange area of the heat exchange region HE between the bottom cooling member 6 and the pedestal 5 are controlled, and power supplied to the heater 3 is controlled, such that the temperature gradient given to the silicon melt 8 by the heater 3 and the cooling mechanism C is stably maintained irrespective of the increase in heat resistance caused by the rise in a solid-liquid interface while continuously monitoring the temperature gradient from the outputs of the thermocouples 10. Specifically, the control unit 11 performs, when the temperature gradient in the silicon melt is smaller than a predetermined value, for example, either one or both of (a) a processing for increasing the power supplied to the heater 3 and (b) a processing for raising the bottom cooling member 6 to increase the heat exchange area of the heat exchange region HE, to increase the temperature gradient. On the other hand, the control unit 11 performs, when the temperature gradient is larger than the predetermined value, processing reverse to the above processings, to reduce the temperature gradient.

When the above control is carried out by the control unit 11, the temperature gradient in a case where the silicon melt 8 is subjected to unidirectional solidification can be more stably maintained from early stages of solidification to complete solidification, so that higher-quality silicon ingot can be produced with good reproducibility and at low cost.

If not only the temperature of the mold 4 but also the temperatures of the heater 3, the pedestal 5, an atmosphere within the apparatus, the bottom cooling member 6, a cooling fluid, etc., or the flow rate of the cooling fluid, and so on are measured and controlled, higher reproducibility can be obtained. If an inverter-controlled motor, a stepping motor, a linear motor, or the like whose rise-and-fall speed is variable is used as the up-and-down motor 12 for raising and lowering the bottom cooling member 6, and the rise-and-fall speed is controlled in conformity with each of the above control items, the temperature gradient can be more finely controlled.

FIG. 3 is a vertical sectional view showing another embodiment of the silicon casting apparatus 1 according to the present invention. Since the configuration of a large part of the silicon casting apparatus 1 is the same as that shown in FIGS. 1A and 1B, previously described, only the difference will be described below.

Referring to FIG. 3, in a silicon casting apparatus 1 in this embodiment, a heat receiving surface 6a of a bottom cooling member 6 is disposed with a predetermined gap G apart from a side surface 5b, serving as a heat radiating surface, of a pedestal 5, and the bottom cooling member 6 is moved in a plane direction of the side surface 5b relative to the pedestal 5 while maintaining the gap G. Thus, there is no sliding surface, which can prevent mechanical wear of both the surfaces. Heat exchange is carried out by radiation and convection of heat between the side surface 5b and the heat receiving surface 6a. Therefore, it is preferable that the gap G between both the surfaces 5b and 6a is not more than 10 mm in order to carry out heat exchange more efficiently.

The pedestal 5 may cause a state where only the vicinity of the side surface 5b is cooled intensively and the center thereof is not sufficiently cooled if the thickness D thereof is too small. In order to make a temperature distribution on the side of a bottom plate 4a of a mold 4 as uniform as possible to improve unidirectional solidification properties of a silicon melt 8, therefore, it is desirable that the thickness D of the pedestal 5 is as large as possible. Although the specific range of the thickness D is not particularly limited, it is preferable that the thickness D is not less than one-sixth of the stretch length L of a contact region between a placement surface 5a and a bottom surface 4c of the mold 4 placed thereon. In order to prevent the pedestal 5 from being so thick as to prevent heat exchange between the mold 4 and the bottom cooling member 6, it is preferable that the thickness D is particularly not more than two-thirds of the stretch length L even in the above range.

The stretch length L herein referred to indicates one, having the smallest length, of line segments formed by cutting away a straight line passing through a center of gravity of the planar shape of the contact region between the placement surface 5a and the bottom surface 4c of the mold 4 placed thereon though a contour line of the planar shape. For example, when the planar shape of the contact region is the rectangular shape, the stretch length L coincides with the length of the short side of the rectangle. When the planar shape of the contact region is the shape of a circle, the stretch length L coincides with the diameter of the circle. The planar shape of the contact region coincides with the planar shape of the placement surface 5a when the placement surface 5a of the pedestal 5 is smaller than the bottom surface 4c of the mold 4, as in the illustrated example, while coinciding with the planar shape of the bottom surface 4c of the mold 4 when the placement surface 5a is larger than the bottom surface 4c.

It is preferable that in the pedestal 5 both the placement surface 5a and a lower surface 5c are planes and are parallel to each other, and the thickness thereof is uniform, as in the illustrated example, considering that the bottom surface 4c of the mold 4 is uniformly cooled. The thickness D in this case can be defined by the distance between both the surfaces. When the thickness of the pedestal 5 is not uniform, however, the minimum thickness is defined as the thickness D of the pedestal 5.

In the silicon casting apparatus 1 in the illustrated embodiment, a nozzle 9 serving as inert gas discharge unit is disposed with the distance between the mold 4 and a heater 3 kept constant during at least the process of producing silicon ingot by unidirectional solidification, as previously described, in such a manner that its front end is projected toward an area, between the mold 4 and the heater 3, above the mold 4 after penetrating the heat insulating member 2. In producing silicon ingot by unidirectional solidification, therefore, inert gas such as Ar can be sprayed on the silicon melt 8 held inside of the mold 4 from the nozzle 9 in an always constant state without changing the distance between a liquid surface of the silicon melt 8 and the front end of the nozzle 9 and without varying a constant state of the inert gas. Therefore, the unidirectional solidification and refinement method, previously described, can be carried out smoothly and uniformly with good reproducibility.

In processes, other than the process of unidirectional solidification, such as a process where a silicon raw material is accommodated within the mold and a process where produced silicon ingot is taken out of the mold, it is preferable that the nozzle 9 can be pulled out of the area between the mold 4 and the heater 3, for example, in order to improve the workability. Further, in the process of unidirectional solidification, it is preferable that the front end of the nozzle 9 is so arranged as to spray inert gas at an approximately central part of the liquid surface of the silicon melt 8. Examples of the inert gas include rare gases such as He, Ne, and Ar. Ar is particularly preferable, as described above, due to its availability.

In the unidirectional solidification and refinement method, when inert gas is sprayed on the liquid surface of the silicon melt 8 from the front end of the nozzle 9, a cavity is formed at the center of the liquid surface to which the inert gas has been sprayed, and flow covering the liquid surface is formed around the cavity. This flow causes the surface of the silicon melt 8 to swing due to the spray of the inert gas, so that new silicon melts 8 are supplied to the liquid surface one after another. Therefore, discharge of SiO gas produced inside of the silicon melt 8 into an ambient atmosphere is promoted so that O as an impurity is effectively removed. Since the liquid surface of the silicon melt 8 is covered by the flow of the inert gas, CO gas is prevented from being mixed into the silicon melt 8 from the ambient atmosphere.

Inert gas is supplied to the nozzle 9 from gas supply unit provided outside of the apparatus through piping (both are not illustrated). An example of the simplest configuration of the gas supply unit is an apparatus so adapted that a regulator (pressure regulator) and a gas flow meter are connected to a gas cylinder filled with inert gas to allow the inert gas to be supplied at a predetermined pressure and flow rate. The gas flow rate may be made more finely adjustable using a mass flow controller.

Figure 4A:
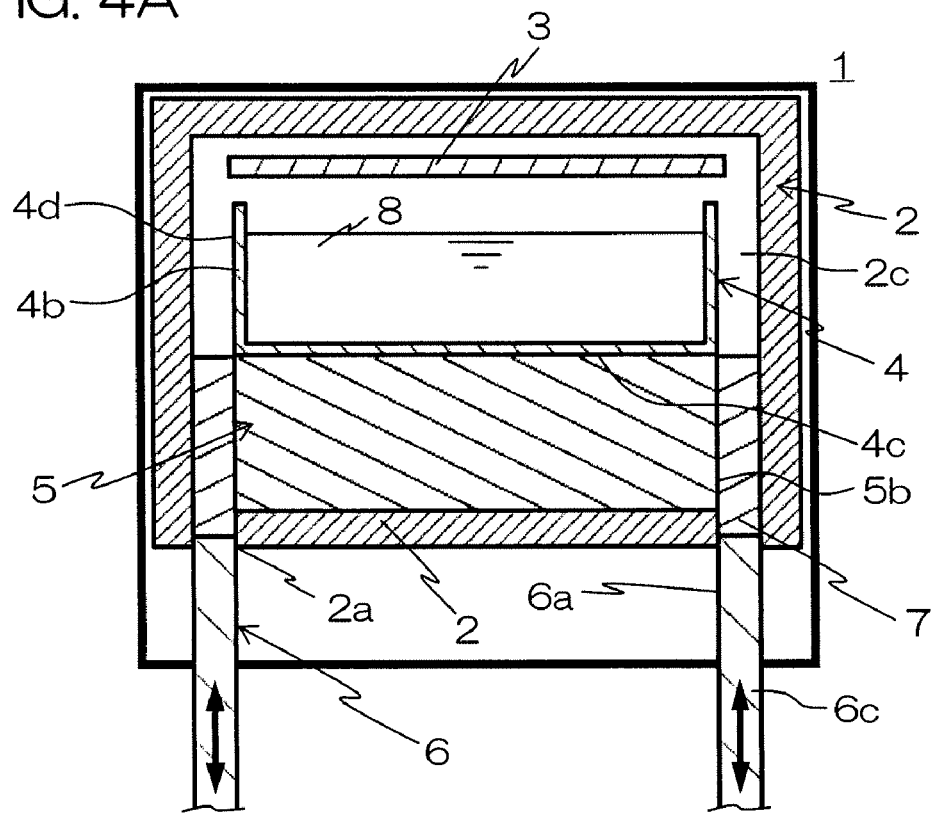
FIG. 4A is a vertical sectional view showing another embodiment of the silicon casting apparatus according to the present invention.
Figure 4B:
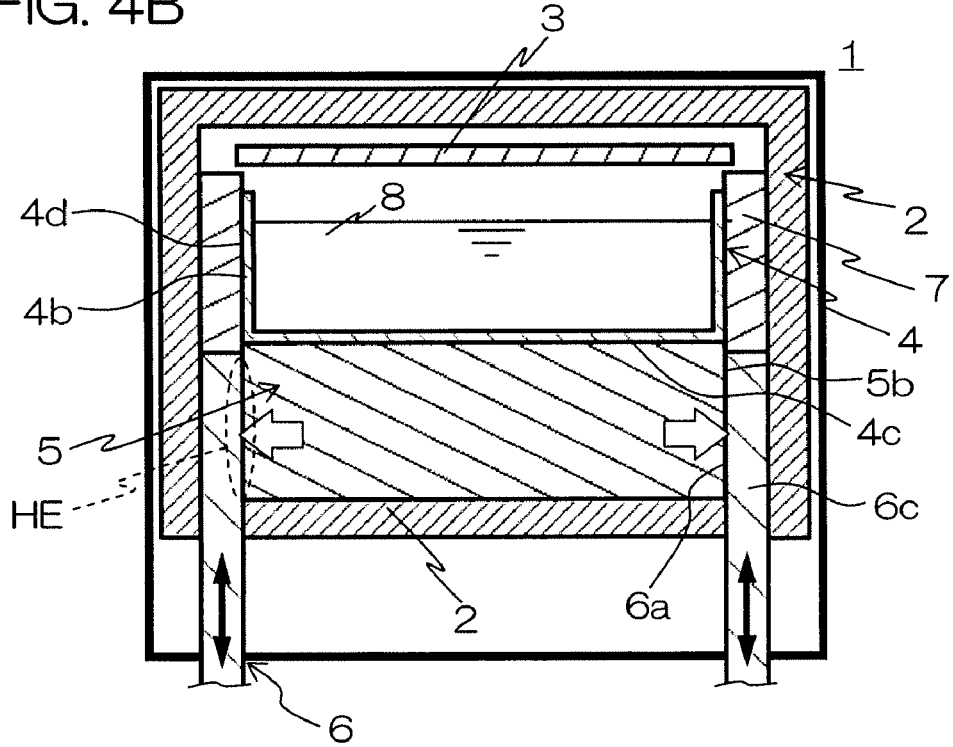
FIG. 4B is a vertical sectional view showing a state where a bottom cooling member in the silicon casting apparatus in the above embodiment is relatively moved.

FIG. 4A is a vertical sectional view showing another embodiment of the silicon casting apparatus 1 according to the present invention, and FIG. 4B is a vertical sectional view showing a state where the bottom cooling member 6 in the silicon casting apparatus 1 in the above embodiment is relatively moved. The silicon casting apparatus 1 in this embodiment is so adapted that the size in the rise-and-fall direction of a movable heat insulating piece 7 raised and lowered in synchronization with the bottom cooling member 6 is set to a size covering the whole of a side surface 4*d* that is an outer side surface of a side plate 4*b* of a mold 4 and a side surface 5*b* of a pedestal 5, and the movable heat insulating piece 7 is raised and lowered as the bottom cooling member 6 is raised and lowered to share the movable heat insulating piece 7 as a heat insulating member of the side surface 4*d* of the mold 4 and a heat insulating member of the side surface 5*b* of the pedestal 5.

The side surface 4*d* of the mold 4 and the side surface 5*b* of the pedestal 5 are made flush with each other, and there is provided, between both the side surfaces and a heat insulating member 2, a gap 2*c* having approximately the same width as that of the movable heat insulating piece 7 and a side plate 6C of the bottom cooling member 6 and being able to accommodate these members.

Referring to FIG. 4A, when the bottom cooling member 6 is lowered to its lowermost position to completely pull the side plate 6*c* out of an opening 2*a* of the heat insulating member 2, the movable heat insulating piece 7 lowered with the bottom cooling member 6 covers the whole of the side surface 5*b* of the pedestal 5 and closes the opening 2*a* of the heat insulating member 2, and the side surface 4*d* of the mold 4 is exposed within a furnace. When a heater 3 is energized in the illustrated state, therefore, heat generated by the heater 3 is more efficiently transferred to the mold 4, which allows a silicon raw material to be quickly melted.

Referring to FIG. 4B, when the bottom cooling member 6 is raised to its uppermost position, the movable heat insulating piece 7 raised with the bottom cooling member 6 covers the whole of the side surface 4*d* of the mold 4 to insulate the mold 4 from heat generated by the heater 3. Further, when the bottom cooling member 6 is raised to an arbitrary position between FIGS. 4A and 4B, which is not illustrated, only a lower part of the side surface 4*d* of the mold 4 is covered with the movable heat insulating piece 7, and a part positioned thereabove is exposed.

Therefore, for example, a silicon melt 8 within the mold 4 can be subjected to unidirectional solidification more smoothly by gradually raising the bottom cooling member 6 and the movable heat insulating piece 7 as a solid-liquid interface of the silicon melt 8 rises, to efficiently heat the silicon melt 8 in the mold 4 by the heat generated by the heater 3 in the upper part of the mold 4 and insulating the silicon melt 8 against the heat generated from the heater 3 by the movable heat insulating piece 7 in the lower part of the mold 4 as well as cooling the silicon melt 8 by gradually increasing on a bottom surface 4*c* of the mold 4 the heat exchange area of a heat exchange region HE in which the side surface 5*b* of the pedestal 5 and the heat receiving surface 6*a* of the bottom cooling member 6 are brought into direct contact with each other in order to carry out heat exchange whereby to gradually increase the amount of heat removed by the bottom cooling member 6 through the heat exchange region HE (indicated by white arrows in FIG. 4B), so that high-quality silicon ingot can be produced with good reproducibility and at low cost.

Figure 5A:
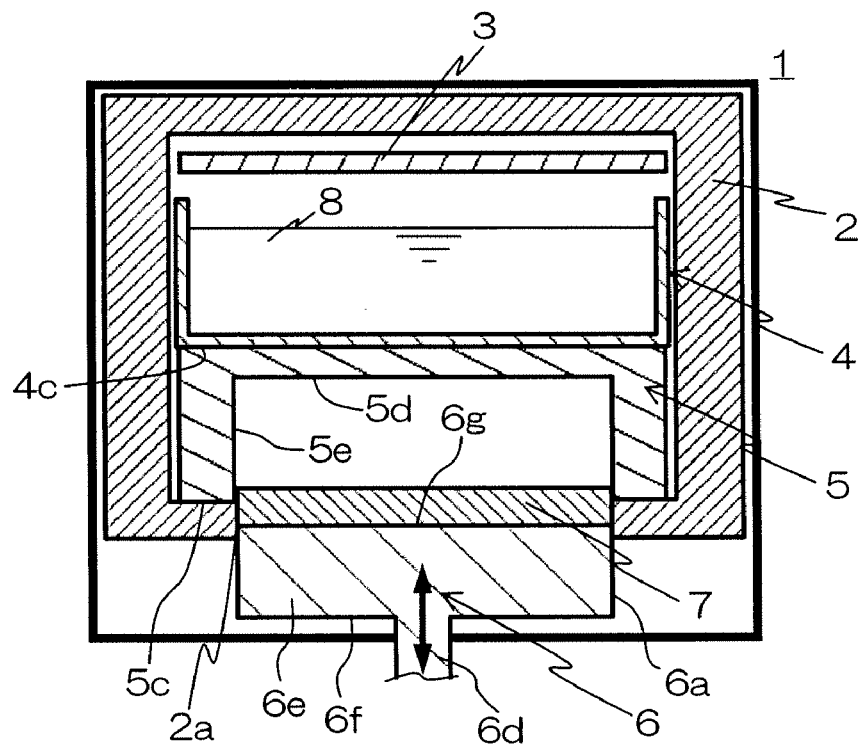
FIG. 5A is a vertical sectional view showing another embodiment of the silicon casting apparatus according to the present invention.
Figure 5B:
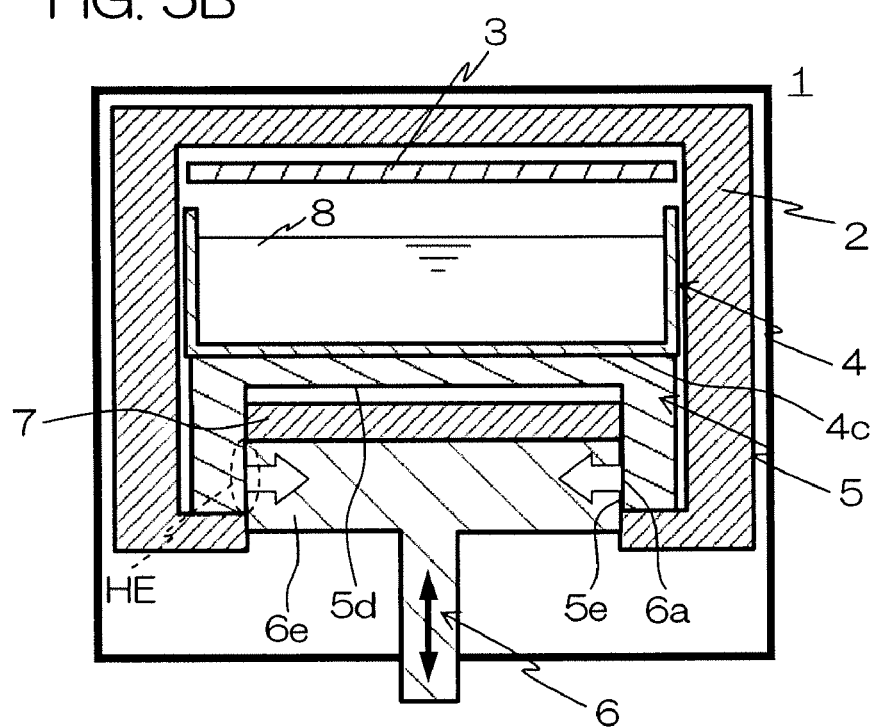
FIG. 5B is a vertical sectional view showing a state where the bottom cooling member in the silicon casting apparatus in the above embodiment is relatively moved.

FIG. 5A is a vertical sectional view showing another embodiment of the silicon casting apparatus 1 according to the present invention, and FIG. 5B is a vertical sectional view showing a state where the bottom cooling member 6 in the silicon casting apparatus 1 in the above embodiment is relatively moved. A silicon casting apparatus 1 in this embodiment differs in the shapes of a pedestal 5 and a bottom cooling member 6.

That is, the bottom cooling member 6 is configured by integrally forming one thick-walled plate section 6*e* having its outer peripheral side surface serving as a heat receiving surface 6*a* and a connection 6*d* extended downward from a lower surface 6*f* of the plate section 6*e* for making connection with an up-and-down motor 12 using a metal material such as stainless steel, for example. The pedestal 5 has on its lower surface 5*c* a counter boring section 5*d* into which the plate section 6*e* of the bottom cooling member 6 is inserted and is formed in such a shape that an inner side surface 5*e*, which is brought into direct contact with the heat receiving surface 6*a*, of the counter boring section 5*d* serves as a heat radiation surface.

As shown in FIG. 5B, the plate section 6*e* is inserted into the counter boring section 5*d*, to move the bottom cooling member 6 in a plane direction of the inner side surface 5*e* relative to the pedestal 5, as indicated by solid arrows in the figure while maintaining a state where the heat receiving surface 6*a* is kept in contact with the inner side surface 5*e*, to change the heat exchange area of a heat exchange region HE formed between both the surfaces. The whole of an upper surface 6*g* of the plate section 6*e* of the bottom cooling member 6 is covered with a movable heat insulating piece 7 in order to prevent unnecessary heat exchange between the bottom cooling member 6 and the pedestal 5.

Referring to FIG. 5A, when the bottom cooling member 6 is lowered to its lowermost position to completely pull the plate section 6*e* out of the counter boring section 5*d* and an opening 2*a* of a heat insulating member 2, the inner side surface 5*e* of the pedestal 5 and the heat receiving surface 6*a* of the bottom cooling member 6 are not at all in contact with each other, i.e., the heat exchange area of the heat exchange region HE is zero. In this state, the opening 2*a* of the heat insulating member 2 is closed by the movable heat insulating piece 7 lowered with the bottom cooling member 6. In melting a silicon raw material to form a silicon melt 8, for example, therefore, heat can be effectively prevented from leaking out of the apparatus from the pedestal 5 or the like having a high thermal conductivity.

Referring to FIG. 5B, when the bottom cooling member 6 is raised to its uppermost position, the inner side surface 5*e* of the pedestal 5 and the heat receiving surface 6*a* of the bottom cooling member 6 are brought into contact with each other over the widest area set in the apparatus in the illustrated embodiment, so that the heat exchange area of the heat exchange region HE reaches its maximum. Further, if the bottom cooling member 6 is moved to an arbitrary position between FIGS. 5A and 5B, which is not illustrated, the heat exchange area of the heat exchange region HE can be set in a stepless manner to an arbitrary area between zero and the maximum.

According to the silicon casting apparatus 1 in the illustrated embodiment, therefore, the amount of heat removed by the bottom cooling member 6 (indicated by hollow arrows in FIG. 5B) through the heat exchange region HE via the pedestal 5 from a bottom surface 4c of a mold 4 can be gradually increased by gradually raising the bottom cooling member 6 as a solid-liquid interface rises to gradually increase the heat exchange area of the heat exchange region HE, starting in the state shown in FIG. 5A.

Consequently, a temperature gradient given to the silicon melt 8 within the mold 4 by a heater 3 and a cooling mechanism C is stably maintained from early stages of solidification to complete solidification, so that high-quality silicon ingot can be produced with good reproducibility and at low cost.

In the illustrated embodiment, the whole of the silicon casting apparatus 1 can be made compact by accommodating the bottom cooling member 6 inside of the pedestal 5.

Figure 6A:
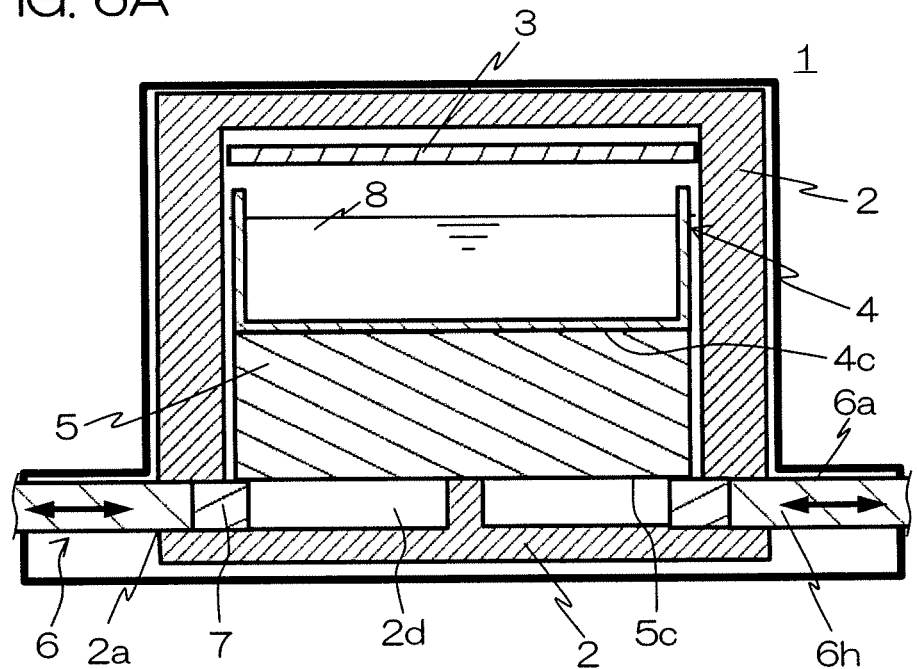
FIG. 6A is a vertical sectional view showing another embodiment of the silicon casting apparatus according to the present invention.

FIG. 6A is a vertical sectional view showing another embodiment of the silicon casting apparatus 1 according to the present invention, and 6B is a vertical sectional view showing a state where the bottom cooling member 6 in the silicon casting apparatus 1 in the above embodiment is relatively moved. The silicon casting apparatus 1 in this embodiment differs in the shape of the bottom cooling member 6 and the direction in which the bottom cooling member 6 is relatively moved.

Figure 6B:
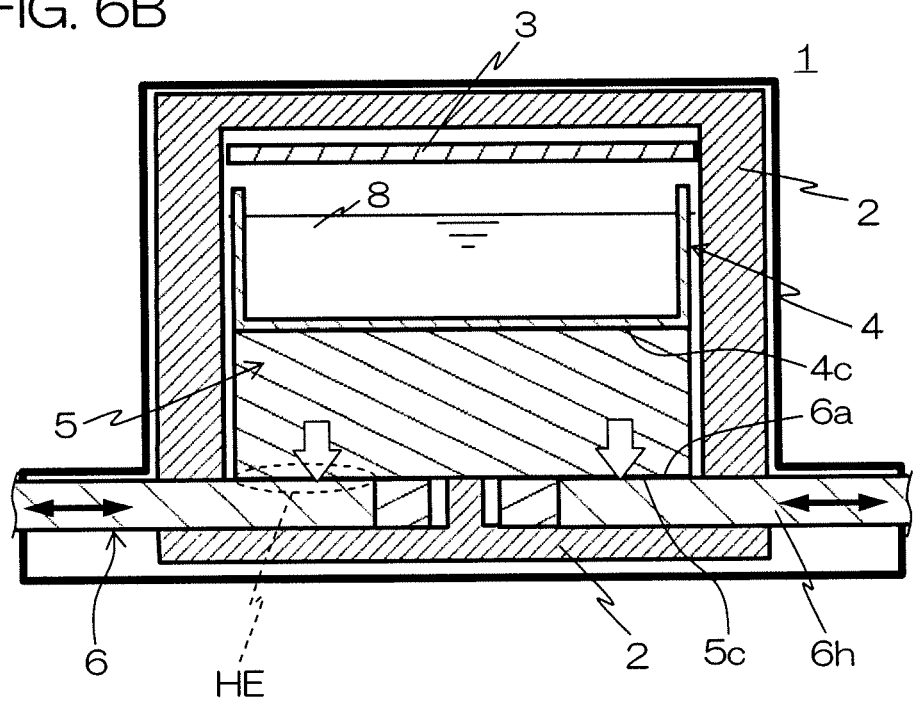
FIG. 6B is a vertical sectional view showing a state where a bottom cooling member in the silicon casting apparatus in the above embodiment is relatively moved.

That is, the bottom cooling member 6 is formed of a plurality of plate pieces 6h each having its upper surface serving as a heat receiving surface 6a. As shown in FIG. 6B, the plate pieces 6h are moved in a plane direction of a lower surface 5c serving as a heat radiation surface of a pedestal 5 relative to the pedestal 5, as indicated by solid arrows in both the figures, while maintaining a state where the heat receiving surface 6a is kept in direct contact with the lower surface 5c, to change the heat exchange area of a heat exchange region HE formed between both the surfaces.

A movable heat insulating piece 7 for closing an opening 2a provided on a side surface of a heat insulating member 2 is attached to a front end of the plate pieces 6h so as to be movable with the plate pieces 6h in a state where the plate pieces 6h is pulled out of the opening 2a, as shown in FIG. 6A. A gap 2d having a width approximately equal to that of the plate pieces 6h and capable of receiving the plate pieces 6h is provided between the lower surface 5c of the pedestal 5 and the heat insulating member 2 positioned below the lower surface 5c.

Referring to FIG. 6A, when the plate pieces 6h is completely pulled out of the gap 2d and the opening 2a of the heat insulating member 2, the lower surface 5c of the pedestal 5 and the heat receiving surface 6a of the bottom cooling member 6 are not at all in contact with each other, i.e., the heat exchange area of the heat exchange region HE is zero. In this state, the opening 2a of the heat insulating member 2 is closed by the movable heat insulating piece 7 pulled out with the bottom cooling member 6. In melting a silicon raw material to form a silicon melt 8, for example, therefore, heat can be effectively prevented from leaking out of the apparatus from the pedestal 5 or the like having a high thermal conductivity.

Referring to FIG. 6B, when the bottom cooling member 6 is inserted into an innermost part of the gap 2d, the lower surface 5c of the pedestal 5 and the heat receiving surface 6a of the bottom cooling member 6 are brought into contact with each other over the widest area set in the apparatus in the illustrated embodiment, so that the heat exchange area of the heat exchange region HE reaches its maximum. Further, if the bottom cooling member 6 is moved to an arbitrary position between FIGS. 6A and 6B, which is not illustrated, the heat exchange area of the heat exchange region HE can be set in a stepless manner to an arbitrary area between zero and the maximum.

According to the silicon casting apparatus 1 in the illustrated embodiment, therefore, the amount of heat removed by the bottom cooling member 6 (indicated by hollow arrows in FIG. 6B) through the heat exchange region HE via the pedestal 5 from a bottom surface 4c of a mold 4 can be gradually increased by gradually inserting the plate material 6h into the innermost part of the gap 2d as a solid-liquid interface rises, to gradually increase the heat exchange area of the heat exchange region HE, starting from the state shown in FIG. 6A.

Consequently, a temperature gradient given to the silicon melt 8 within the mold 4 by a heater 3 and a cooling mechanism C is stably maintained from early stages of solidification to complete solidification, so that high-quality silicon ingot can be produced with good reproducibility and at low cost.

Since the lower surface 5c wider than a side surface 5b and an inner side surface 5e of the pedestal 5 serves as a heat radiation surface in the illustrated embodiment, the cooling efficiency can be also improved by further increasing the heat exchange area of the heat exchange region HE. Further, the bottom surface 4C of the mold 4 is uniformly cooled by making a temperature distribution in the whole of the pedestal 5 more uniform, as compared with that in a case where the side surface 5b and the inner side surface 5e of the pedestal 5 serve as a heat radiation surface, which allows unidirectional solidification properties of the silicon melt 8 to be improved.

Figure 7A:
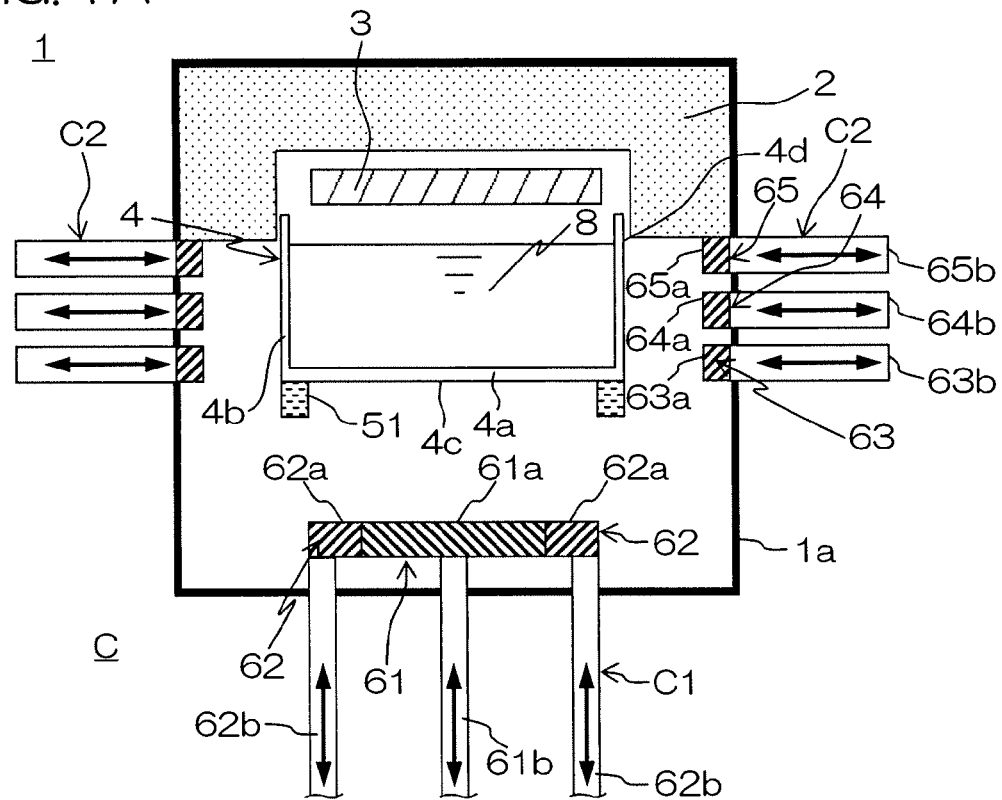
FIG. 7A is a vertical sectional view showing another embodiment of the silicon casting apparatus according to the present invention.
Figure 7B:
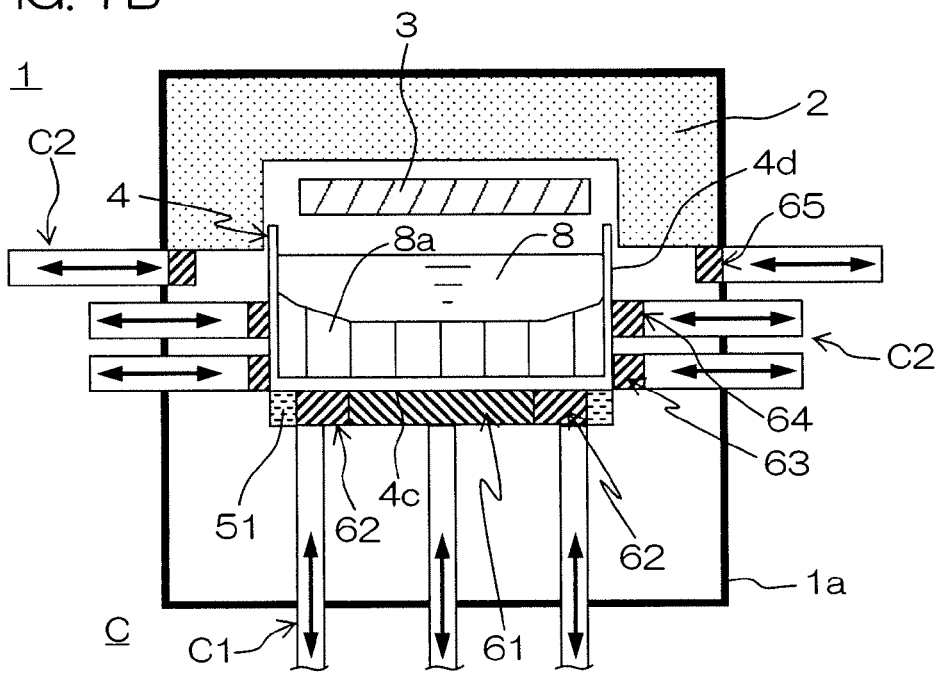
FIG. 7B is a vertical sectional view showing a state where a bottom cooling member and a side cooling member in the silicon casting apparatus in the above embodiment are relatively moved.

FIG. 7A is a vertical sectional view showing another embodiment of the silicon casting apparatus 1 according to the present invention, and FIG. 7B is a vertical sectional view showing a state where the bottom cooling member C1 and the side cooling member C2 in the silicon casting apparatus 1 in the above embodiment are relatively moved.

Referring to both the figures, a silicon casting apparatus 1 in this embodiment comprises a mold 4 for holding a silicon melt 8 therein, comprising a bottom plate 4a and a side plate 4b raised upward from a peripheral edge of the bottom plate 4a, a heater 3 serving as a heating mechanism disposed above the mold 4, a cooling mechanism C comprising the bottom cooling member C1 for cooling a bottom surface 4c that is a lower surface of the bottom plate 4a of the mold 4 and the side cooling member C2 for cooling a side surface 4d that is an outer side surface of the side plate 4b of the mold 4, and a shell body 1a that can be sealed with the members accommodated therein and allows silicon ingot to be produced by unidirectional solidification in a state where the inside thereof is in an atmosphere of inert gas such as Ar depressurized to 0.65 to 40 kPa. A heat insulating member 2 for transferring radiation from the heater 3 to the silicon melt 8 within the mold 4 while restraining a heat loss to the utmost is disposed above the heater 3 within the shell body 1a. Usable as the heat insulating member 2, the heater 3, and the mold 4 are ones having the same configurations as the above.

The heater 3 and the mold 4 are held with the distance therebetween kept constant during at least the process of producing silicon ingot by unidirectional solidification in the same manner as previously described. In other processes such as a process where a silicon raw material is accommodated within the mold and a process where the produced silicon ingot is taken out of the mold, it is preferable that either one of the heater 3 and the mold 4 can be moved to increase the distance therebetween, the mold can be taken out of the apparatus, or the heating mechanism can be removed, for example, in order to improve the workability.

The mold 4 is held at a predetermined position within the shell body 1a by a supporting member 51 for supporting only a peripheral portion of the bottom surface 4c and exposes other portions in order to contact the bottom cooling member C1. Although the supporting member 51 can be formed of various types of materials that can withstand high temperatures of approximately 1600° C. in an inert gas atmosphere, it is preferable that the supporting member 51 is formed of graphite because the graphite is simply processed and is low in cost, and the increase in the purity thereof allows the concentration of impurities, which lower the quality of the silicon ingot, to be reduced. Further, the shell body 1a is formed of stainless steel, for example.

The bottom cooling member C1 comprises a plurality of cooling sections 61 and 62 respectively having divisional heat receiving surfaces 61a and 62a in which a heat receiving surface, which is contact to the bottom surface 4c of the mold 4, is divided into the center and the peripheral edge. Connections 61b and 62b extended downward to reach the outside of the shell body 1a are respectively connected to the bottoms of the cooling sections 61 and 62, and up-and-down motors (not shown) for individually raising and lowering the cooling sections 61 and 62 are respectively connected to the connections 61b and 62b.

The cooling sections 61 and 62 are relatively moved (raised and lowered) in a vertical direction indicated by solid arrows in the figures perpendicular to the bottom surface 4c of the mold 4 between a state where the divisional heat receiving surfaces 61a and 62a are individually contact to the bottom surface 4c and a state where they are spaced apart from the bottom surface 4c by individually driving the up-and-down motors in order to enlarge a heat exchange region formed on the bottom surface 4c of the mold 4 from the center to the peripheral edge of the bottom surface 4c in order.

That is, the heat exchange region formed on the bottom surface 4c of the mold 4 can be enlarged in order from the center to the peripheral edge of the bottom surface 4c, starting from a state where all the cooling sections 61 and 62 are lowered to space the divisional heat receiving surfaces 61a and 62a apart from the bottom surface 4c of the mold 4 as shown in FIG. 7A, first raising the cooling section 61 at the center to contact the divisional heat receiving surface 61a to the bottom surface 4c, which is not illustrated, and finally raising the cooling section 62 at the peripheral edge to contact the divisional heat receiving surface 62a to the bottom surface 4c as shown in FIG. 7B.

The cooling section 61 can be formed such that the divisional heat receiving surface 61a has an arbitrary planar shape such as circular, elliptical, rectangular, or polygonal shape. The cooling section 62 can be formed in an annular shape comprising the annular divisional heat receiving surface 62a surrounding the divisional heat receiving surface 61a having the above-mentioned planar shape. The plurality of cooling sections 62 can be also arranged in an annular shape around the cooling section 61.

The side cooling member C2 comprises a plurality of cooling sections 63, 64, and 65 respectively having three divisional heat receiving surfaces 63a, 64a, and 65a into which the heat receiving surface, which is contact to the side surface 4d of the mold 4, is divided in the height direction of the mold 4. Connections 63b, 64b, and 65b extended in the horizontal direction to reach the outside of the shell body 1a are respectively connected to portions on the opposite side of the divisional heat receiving surfaces 63a, 64a, and 65a of the cooling sections 63, 64, and 65, and motors for horizontal movement (not shown) for individually moving the cooling sections 63, 64, and 65 in the horizontal direction are respectively connected to the connections 63b, 64b, and 65b.

The cooling sections 63, 64, and 65 are relatively moved in a horizontal direction (horizontally moved) indicated by solid arrows in the figures perpendicular to the side surface 4d between a state where the divisional heat receiving surfaces 63a, 64a, and 65a are individually contact to the side surface 4d of the mold 4 and a state where they are spaced apart from the side surface 4d, by individually driving the motors for horizontal movement in order to enlarge the heat exchange region formed on the side surface 4d of the mold 4 from the lower part to the upper part in order.

That is, the heat exchange region formed on the side surface 4d of the mold 4 can be enlarged from the lower part to the upper part in order, starting from a state where all the cooling sections 63, 64, and 65 are made to retreat toward a wall surface of the shell body 1a to space the divisional heat receiving surfaces 63a, 64a, and 65a apart from the side surface 4d of the mold 4 as shown in FIG. 7A, first horizontally moving the lowermost cooling section 63 toward the mold 4 to contact the divisional heat receiving surface 63a to the side surface 4d, which is not illustrated, then horizontally moving the middle cooling section 64 toward the mold 4 to contact the divisional heat receiving surface 64a to the side surface 4d as shown in FIG. 7B, and finally horizontally moving the uppermost cooling section 65 toward the mold 4 to contact the divisional heat receiving surface 65a to the side surface 4d, which is not illustrated.

It is preferable that respective pluralities of the cooling sections 63 to 65 are provided so as to surround the mold 4. In a case where the mold 4 comprises a side plate 4b in the shape of four flat plates, for example, respective four cooling sections 63 to 65 can be arranged around the mold 4 in correspondence with their surfaces. In a case where the mold 4 comprises a side plate 4b in the shape of a cylinder, respective pluralities of cooling sections 63 to 65 can be arranged around the mold 4 so as to surround the cylinder.

Each of the cooling sections 61 to 65 can be formed of stainless steel or the like. A cooling liquid such as water being circulated inside of the cooling section cools the cooling sections 61 to 65.

In order to produce silicon ingot by a unidirectional solidification method using the silicon casting apparatus 1 as illustrated, the mold 4 is first filled with a silicon raw material and the shell body 1a is sealed to bring the shell body 1a into a depressurized inert gas atmosphere.

As shown in FIG. 7A, the heater 3 is then energized in a state where the respective divisional heat receiving surfaces 61a to 65a of all the cooling sections 61 to 65 in the bottom cooling member C1 and the side cooling member C2 are spaced apart from the bottom surface 4c and the side surface 4d of the mold 4, and the silicon raw material with which the mold 4 is filled is melted to form the silicon melt 8. This can prevent radiant heat from the heater 3 from being lost, and the silicon raw material is melted efficiently in a shorter time period.

Then, when the cooling section 61 in the bottom cooling member C1 is raised to contact the divisional heat receiving surface 61a to the center of the bottom surface 4c of the mold 4, a temperature gradient occurs in the silicon melt 8 within the mold 4 from its upper part heated by the heater 3 to start unidirectional solidification, so that a solid-liquid interface serving as the boundary between a solid layer (a solidification structure) 8a of silicon and the silicon melt 8 starts to gradually rise. As the solid-liquid interface rises so that the distance from the bottom surface 4c of the mold 4 increases, heat resistance increases so that the temperature gradient tends to decrease. Therefore, the cooling section 62 in the bottom cooling member C1 is then raised as the solid-liquid interface rises by the progress of unidirectional solidification, to contact the divisional receiving surface 62*a* to the peripheral edge of the bottom surface 4*c*, and the cooling sections 63 to 65 in the side cooling member C2 are further horizontally moved in order from below, as described above, to contact the divisional receiving surfaces 63*a* to 65*a* to the side surface 4*d* of the mold 4*d* in order from below.

Thus, the heat exchange region between the side cooling member C2 and the side surface 4*d* of the mold 4 can be changed so as to be enlarged from the lower part to the upper part in order in the height direction. According to the above-mentioned silicon casting apparatus 1, therefore, the temperature gradient can be stably maintained from early stages of solidification to complete solidification by controlling more precisely the amount of heat removed from the mold 4 by the cooling mechanism C, so that higher-quality silicon ingot can be produced with good reproducibility and at as low cost as possible. Further, in the above-mentioned casting apparatus 1, there is no sliding surface, which can prevent mechanical wear of each of the surfaces.

When the respective divisional heat receiving surfaces 63*a* to 65*a* of the cooling sections 63 to 65 positioned above the solid-liquid interface are contact to the side surface 4*d* of the mold 4 before the solid-liquid interface rises, the vicinity of the liquid surface of the silicon melt 8 which must keep a melt state up to the final stage of unidirectional solidification is solidified so that the melt is left inside of the solidification structure. Thereafter, the silicon ingot is liable to be broken due to volume expansion when the melt that has been left inside is solidified. Therefore, it is preferable that the divisional heat receiving surfaces 63*a* to 65*a* are contact to the side surface 4*d* at the time point where the solid-liquid interface at that time rises upward sufficiently and more specifically, by not less than 50 mm.

If a movable heat insulating member that can be contact to the bottom surface 4*c* and the side surface 4*d* in a state where each of the divisional heat receiving surfaces 61*a* to 65*a* is spaced apart from the bottom surface 4*c* and the side surface 4*d* of the mold 4, which is not illustrated, is separately provided, time and cost required to produce the silicon ingot can be further saved by effectively restraining a heat leak in melting the silicon raw material to form the silicon melt 8.

FIG. 8A is a vertical sectional view showing another embodiment of the silicon casting apparatus 1 according to the present invention, and FIG. 8B is a vertical sectional view showing a state where the bottom cooling member C1 and the side cooling member C2 in the silicon casting apparatus 1 in the above embodiment are relatively moved. A silicon casting apparatus 1 in this embodiment differs in the configurations of both cooling members C1 and C2.

That is, the bottom cooling member C1 comprises only one cooling section 66 comprising a heat receiving surface 66*a* having a planar shape corresponding to the planar shape of nearly the whole surface, which is exposed between supporting members 51, of a bottom surface 4*c* of a mold 4 and directly contact to the bottom surface 4*c*. A connection 66*b* extended downward to reach the outside of a shell body 1*a* is connected to the bottom of the cooling section 66, and an up-and-down motor (reference numeral 12 in FIG. 10) for raising and lowering the cooling section 66 in a vertical direction indicated by solid arrows in the figures is connected to the connection 66*b*. The cooling section 66 is raised and lowered between its lowermost position where the heat receiving surface 66*a* is spaced apart from the bottom surface 4*c* of the mold 4, as shown in FIG. 8A, and its uppermost position where the heat receiving surface 66*a* is contact to the bottom surface 4*c*, as shown in FIG. 8B, by driving the up-and-down motor 12.

The side cooling member C2 comprises a cooling section 67 comprising a heat receiving surface 67*a* which is brought into direct contact with a side surface 4*d* of the mold 4, and moved in a plane direction of the side surface 4*d* relative to the mold 4 while maintaining a state where the heat receiving surface 67*a* is kept in contact with the side surface 4*d* as indicated by solid arrows in the figures. A connection 67*b* extended downward to reach the outside of the shell body 1*a* is connected to the bottom of the cooling section 67, and an up-and-down motor (reference numeral 12 in FIG. 10) for raising and lowering the cooling section 67 in the vertical direction, as described above, is connected to the connection 67*b*.

A movable heat insulating piece 7 is attached to an upper end of the cooling section 67 so as to be capable of being raised and lowered with the cooling section 67. The side surface 4*d* of the mold 4 and a side surface of the supporting member 51 are made flush with each other, and there is provided, between both the side surfaces and a heat insulating member 2, a gap 2*e* having approximately the same width as that of the cooling section 67 and the movable heat insulating piece 7 and being able to accommodate these members.

The cooling section 67 is so adapted that it is raised and lowered by driving the up-and-down motor 12 among its lowermost position where the heat receiving surface 67*a* completely pulled out downward from the gap 2*e* is not in contact with the side surface 4*d* as shown in FIG. 8A, its uppermost position where the heat receiving surface 67*a* is in contact with the side surface 4*d* over the widest area by being inserted into the gap 2*e* as shown in FIG. 8B, and an arbitrarily raised position between the two positions which is not illustrated, so that the contact area between the heat receiving surface 67*a* and the side surface 4*d*: can be increased and decreased in a stepless manner.

It is preferable that the cooling section 67 is formed into such a shape as to surround the side surface 4*d* of the mold 4. In a case where the mold 4 comprises a side plate 4*b* in the shape of four flat plates, the cooling section 67 may be formed into the shape of a plate having four faces respectively conforming to side surfaces 4*d* of the side plate 4*b* and being continuous from or independent of one another. In a case where the mold 4 comprises a side plate 4*b* in the shape of a cylinder, the cooling section 67 may be formed in the shape of a cylinder conforming to the side surface 4*d*, or in such a shape that the cylinder is divided into a plurality of parts in the circumferential direction, or the like.

In order to produce silicon ingot by a unidirectional solidification method using the silicon casting apparatus 1 as illustrated, first the mold 4 is filled with a silicon raw material and the shell body 1*a* is sealed to bring the shell body 1*a* into a depressurized inert gas atmosphere.

Then the heater 3 is energized in a state where the cooling section 66 in the bottom cooling member C1 is lowered to the lowermost position to space the heat receiving surface 66*a* from the bottom surface 4*c* of the mold 4, and the cooling section 67 in the side cooling member C2 is completely pulled out of the gap 2*e* and lowered to the lowermost position so that the heat receiving surface 67*a* is not in contact with the side surface 4*d*, as shown in FIG. 8A. Consequently, an opening, on the side of the supporting member 51, of the gap 2*e* is closed by the movable heat insulating piece 7 lowered with the cooling section 67, and the side surface 4*d* of the mold 4 is exposed within a furnace. Accordingly, the silicon melt 8 can be formed efficiently in a shorter time period by transferring heat generated from the heater 3 more efficiently to the mold 4 to quickly melt the silicon raw material.

Then, when the cooling section 66 in the bottom cooling member C1 is raised to the uppermost position shown in FIG. 8B to contact the heat receiving surface 66a to the bottom surface 4c of the mold 4, a temperature gradient occurs in the silicon melt 8 within the mold 4 from its upper part heated by the heater 3 to start unidirectional solidification, so that a solid-liquid interface serving as the boundary between a solid layer (a solidification structure) 8a of silicon and the silicon melt 8 starts to gradually rise.

In this case, the side surface 4d of the mold 4 and the cooling section 67 are insulated by the movable heat insulating piece 7 interposed therebetween for closing the opening of the gap 2e. Therefore, it can prevent that the start of smooth unidirectional solidification by the cooling section 66 is prevented by cooling the vicinity of the lower side of the side surface 4d of the mold 4 in very early stages of solidification.

When the solid-liquid interface rises and the distance from the bottom surface 4c of the mold 4 increases, heat resistance increases and the temperature gradient tends to decrease. Therefore, then the cooling section 67 in the side cooling member C2 is gradually raised as the solid-liquid interface rises by the progress of unidirectional solidification, to gradually bring the heat receiving surface 67a into contact with the side surface 4d of the mold 4.

Thus, the heat exchange region between the side cooling member C2 and the side surface 4d of the mold 4 can be changed so as to be enlarged form the lower part to the upper part in order in the height direction and even in a stepless manner as previously described in this case. According to the above-mentioned silicon casting apparatus 1, therefore, the temperature gradient can be stably maintained from early stages of solidification to complete solidification by controlling more finely the amount of heat removed from the mold 4 by the cooling mechanism C, so that higher-quality silicon ingot can be produced with good reproducibility and at as low cost as possible.

When the upper end of the heat receiving surface 67a of the cooling section 67 is above the solid-liquid interface, a melt is left inside of the solidification structure by the same mechanism as described above. Then the silicon ingot is liable to be broken due to volume expansion in a case where the melt that has been left inside is solidified. Therefore, it is preferable that the cooling section 67 is gradually raised as the solid-liquid interface rises while always maintaining a state where the upper end is below the solid-liquid interface by not less than a predetermined size (preferably 50 mm).

Figure 9A:
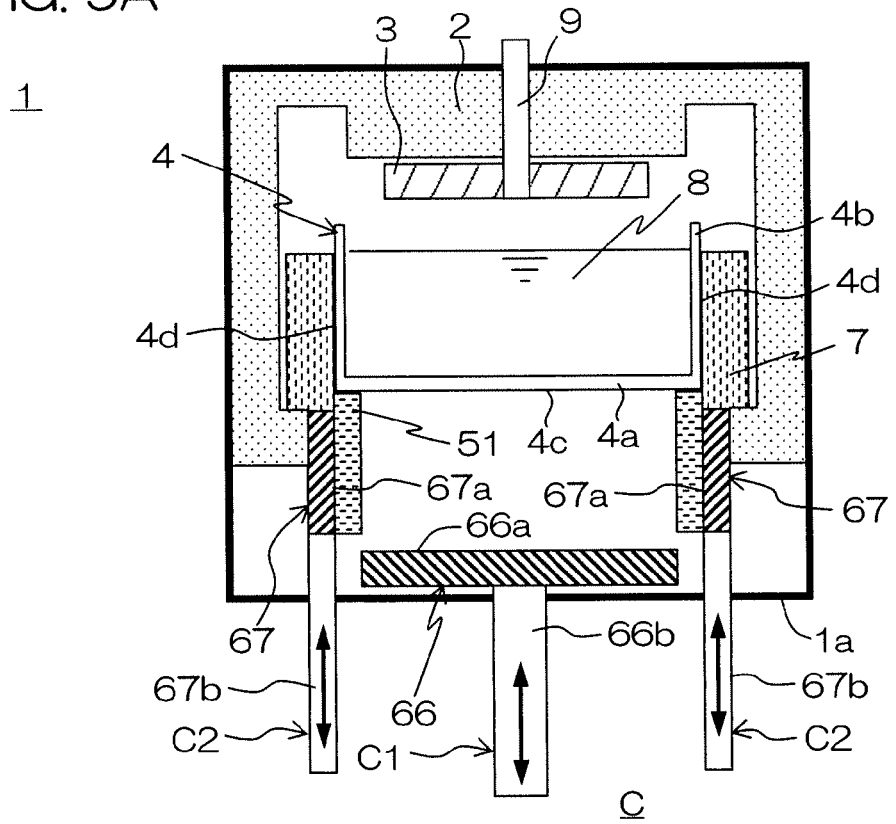
FIG. 9A is a vertical sectional view showing another embodiment of the silicon casting apparatus according to the present invention.
Figure 9B:
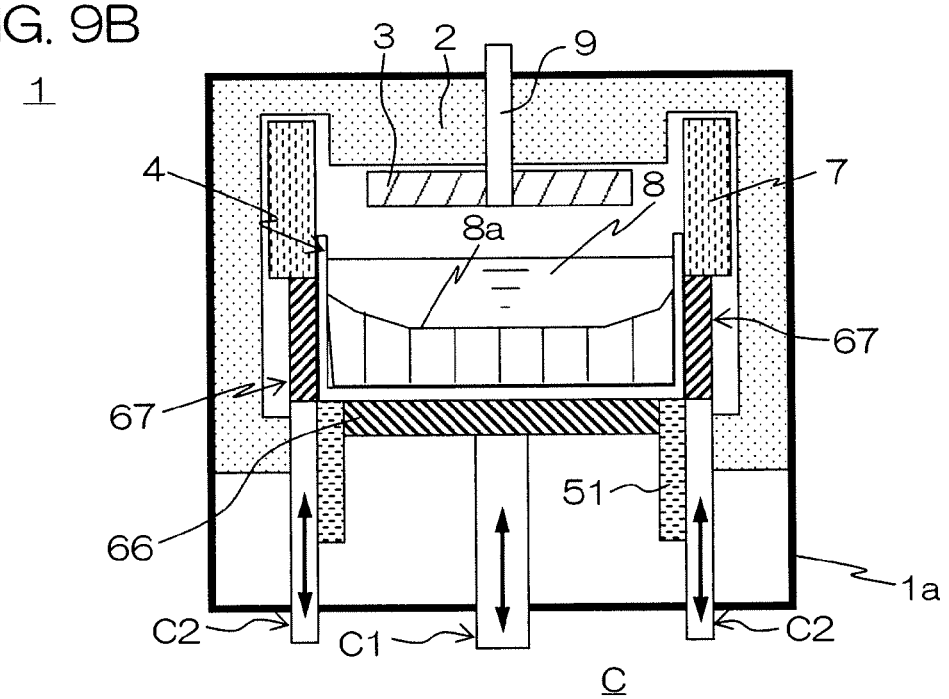
FIG. 9B is a vertical sectional view showing a state where a bottom cooling member and a side cooling member in the silicon casting apparatus in the above embodiment are relatively moved.

FIG. 9A is a vertical sectional view showing another embodiment of the silicon casting apparatus 1 according to the present invention, and FIG. 9B is a vertical sectional view showing a state where the bottom cooling member C1 and the side cooling member C2 in the silicon casting apparatus 1 in the above embodiment are relatively moved.

The silicon casting apparatus 1 in this embodiment differs in that it comprises a nozzle 9 serving as inert gas discharge unit. The nozzle 9 is disposed with the distance from a mold 4 and an annular heater 3 kept constant during the at least process of producing silicon ingot by unidirectional solidification, as in the previous case, in such a manner that its front end is projected toward the center of the annular heater 3 after penetrating a shell body 1a and a heat insulating member 2 above the heater 3.

In producing silicon ingot by unidirectional solidification, therefore, inert gas such as Ar can be sprayed on a silicon melt 8 held inside of the mold 4 from the nozzle 9 in an always constant state without changing the distance between a liquid surface of the silicon melt 8 and the front end of the nozzle 9 and without varying a constant state of the inert gas, so that the unidirectional solidification and refinement method, previously described, can be carried out smoothly and uniformly with good reproducibility.

In processes, other than the process of unidirectional solidification, such as a process where a silicon raw material is accommodated within the mold and a process where produced silicon ingot is taken out of the mold, it is likewise preferable that the nozzle 9 can be pulled out of an area between the mold 4 and the heater 3, for example, in order to improve the workability. In the process of unidirectional solidification, it is preferable that the front end of the nozzle 9 is so arranged as to spray inert gas at an approximately central part of the liquid surface of the silicon melt 8.

A supporting member 51 has its size, in the direction in which the cooling section 67 is raised and lowered, set to a size slightly larger than the size in the same direction of the cooling section 67, and functions to cover a heat receiving surface 67a of the cooling section 67 so as not to be exposed to the bottom of the mold 4 in a state where the cooling section 67 is lowered to its lowermost position, as shown in FIG. 9A. A movable heat insulating piece 7 on the cooling section 67 has its size, in the direction in which the cooling section 67 is raised and lowered, set to a size approximately equal to the height of a side surface 4d of the mold 4, and functions to prevent heat from escaping by covering the side surface 4d of the mold 4 in a state where the cooling section 67 is lowered to the lowermost position, as shown in FIG. 9A. Therefore, the silicon melt 8 can be formed efficiently in a shorter time period by transferring heat generated from the heater 3 more efficiently to the mold 4 to quickly melt the silicon raw material.

Figure 10:
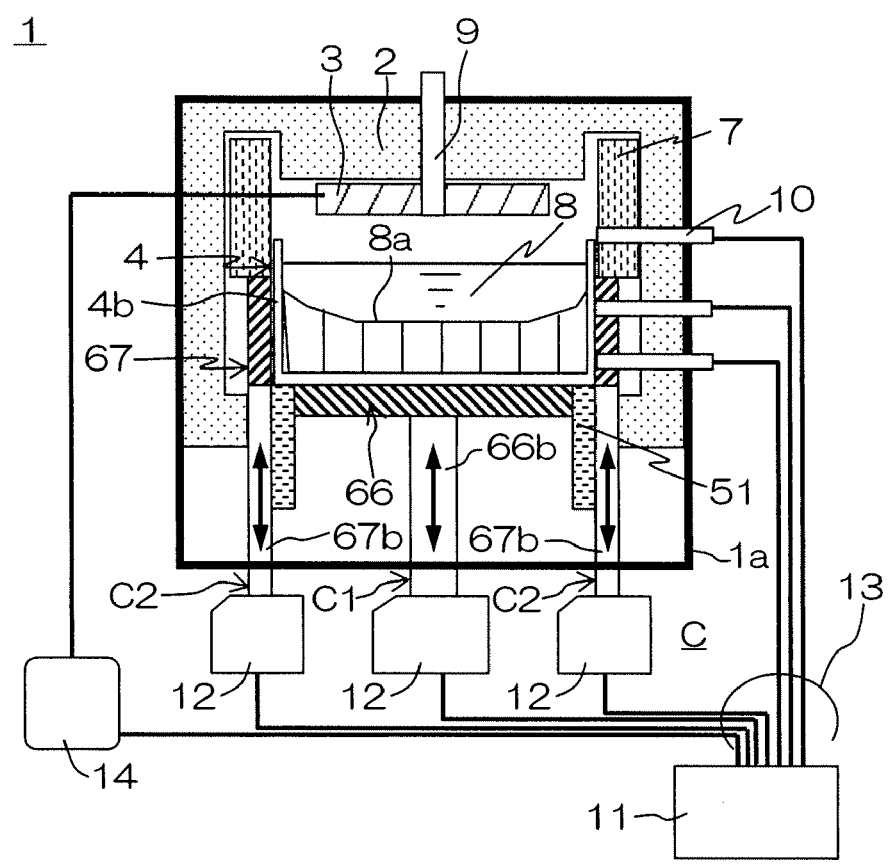
FIG. 10 is a vertical sectional view showing another embodiment in which temperature detection unit and control unit are combined with the silicon casting apparatus shown in FIGS. 9A and 9B.

FIG. 10 is a vertical sectional view showing another embodiment in which temperature detection unit and control unit are combined with the silicon casting apparatus shown in FIGS. 9A and 9B. Since the configuration of other members is the same as that previously described, only the difference will be described below.

Referring to FIG. 10, thermocouples 10 are respectively provided at three points, i.e., the vicinity of the upper side of a side plate 4b of a mold 4, the vicinity of the lower side thereof, and a point intermediate therebetween. This allows a temperature gradient given to a silicon melt 8 within the mold 4 to be found. An output of each of the thermocouples 10 is fed to control unit 11 through a control cable 13. The control unit 11 calculates the temperature gradient given to the silicon melt 8 from the outputs of the three thermocouples 10, and controls the driving of a heater 3 and up-and-down motors 12 through the control cable 13 on the basis of the results of the calculation. The control unit 11 further controls the driving of gas supply unit connected to a nozzle 9, an exhaust pump system for depressurizing a shell body 1a, and so on, which are not illustrated. Usable as each of the above-mentioned members is one having the same configuration as the above.

The procedure for producing silicon ingot using the above-mentioned silicon casting apparatus 1 will be described while referring to FIGS. 9A to 10.

First, when the mold 4 is filled with a silicon raw material and the shell body 1a is sealed to start the control unit 11, the control unit 11 operates the exhaust pump system to depressurize the shell body 1a and operates the gas supply unit to supply inert gas to the shell body 1a through the nozzle 9, whereby to bring the shell body 1a into a depressurized inert gas atmosphere.

Then the control unit 11 lowers a cooling section 66 in a bottom cooling member C1 to its lowermost position to space a heat receiving surface 66a thereof from a bottom surface 4c of the mold 4, and lowers a cooling section 67 in a side cooling member C2 to its lowermost position so that the heater 3 and the mold 4 are surrounded by a heat insulating member 2 and a movable heat insulating piece 7, as shown in FIG. 9A. The heater 3 is energized to heat the mold 4 to temperatures of approximately 1420° C. to 1550° C., thereby melting the silicon raw material. This can prevent radiant heat from the heater 3 from being lost to melt the silicon raw material efficiently in a shorter time period.

When the silicon raw material is melted to form the silicon melt 8, the control unit 11 drives the up-and-down motors 12 while spraying inert gas on a liquid surface of the silicon melt 8 from a front end of the nozzle 9 as well as monitoring a temperature gradient in the silicon melt 8 from the outputs of the three thermocouples 10, to raise the cooling section 66 in the bottom cooling member C1 to its uppermost position shown in FIG. 9B, thereby contact the heat receiving surface 66a to the bottom surface 4c of the mold 4 to start removal of heat. Thus, a solid-liquid interface serving as the boundary between a solid layer (solidification structure) 8a of silicon and the silicon melt 8 starts to gradually rise.

While continuously monitoring the temperature gradient given to the silicon melt 8 by the heater 3 and a cooling mechanism C by the outputs of the thermocouples 10, the control unit 11 drives the up-and-down motors 12 at an arbitrary time point on the basis of the results of the monitoring to gradually raise the cooling section 67 in the side cooling member C2, thereby bringing a heat receiving surface 67a kept in contact with the side surface 4d of the mold 4 as well as changing a heat exchange region serving as a contact region between both the surfaces to gradually enlarge the heat exchange region in a stepless manner from the lower part to the upper part in order in the height direction. In addition thereto, the control unit 11 controls power supplied to the heater 3.

Consequently, the temperature gradient in subjecting the silicon melt 8 to unidirectional solidification can be more stably maintained from early stages of solidification to complete solidification, so that higher-quality silicon ingot can be produced with good reproducibility and at low cost.

If not only the temperature of the mold 4 but also the temperatures of the heater 3, an atmosphere within the shell body 1a, the cooling sections 66 and 67, a cooling fluid, etc., or the flow rate of the cooling fluid, and so on are measured and controlled, higher reproducibility can be obtained. Particularly if an inverter-controlled motor, a stepping motor, a linear motor, or the like whose rise-and-fall speed is variable is used as the up-and-down motor 12 for raising or lowering the cooling section 67 in the side cooling member C2, and the rise-and-fall speed is controlled in conformity with each of the above control items, the temperature gradient can be controlled more finely.

The configuration of the present invention is not limited to those in the embodiments illustrated in the figures, described above. Various design changes can be made without departing from the scope of the present invention.

Although a programmable controller is exemplified as the control unit 11 in the embodiments shown in FIGS. 2 and 10, for example, it can be replaced with a combination of a control interface with a general-purpose personal computer as the control unit 11.

EXAMPLES

The present invention will be described in more details on the basis of examples.

<<Silicon Casting Apparatus>>

Figure 11A:
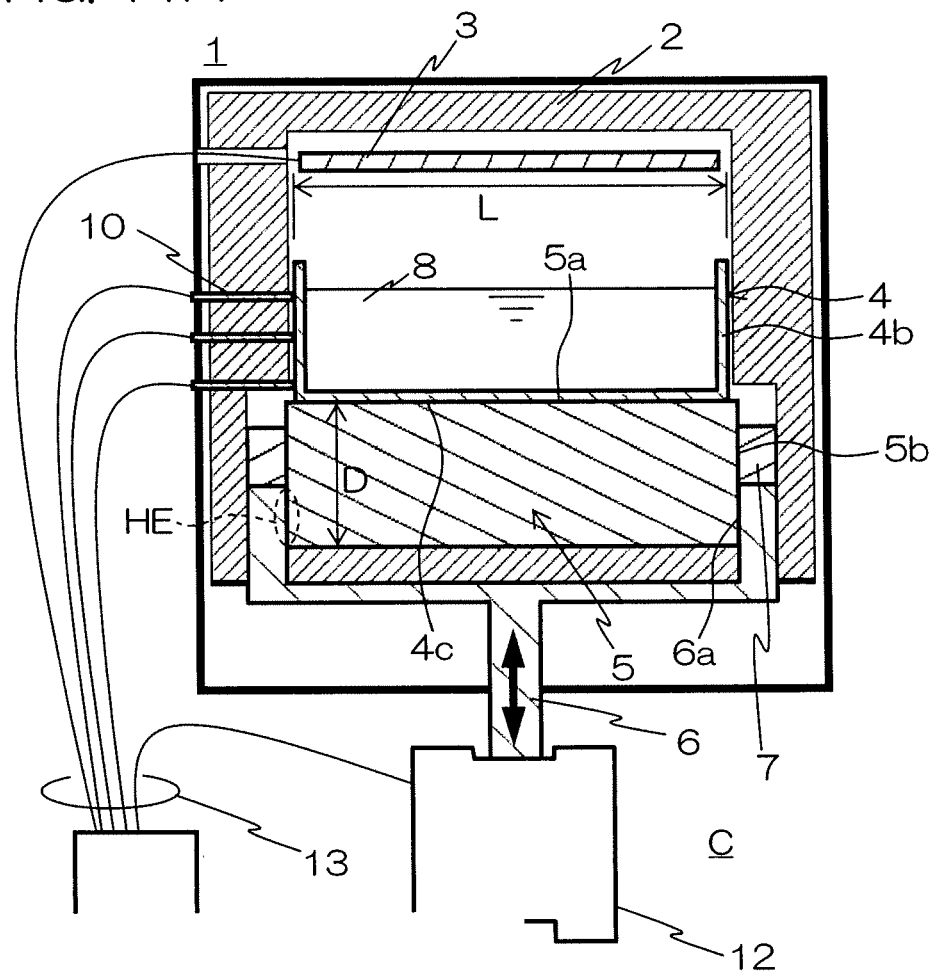
FIG. 11A is a vertical sectional view showing a silicon casting apparatus manufactured in an example of the present invention.

A silicon casting apparatus 1 shown in FIG. 11A having the same configuration as that shown in FIG. 2 except that a bottom surface 4c of a mold 4 is smaller than a placement surface 5a of a pedestal 5, and the planar shape of a contact region coincides with the planar shape of the bottom surface 4c of the mold 4 is configured by a combination of the following members.

(Heat Insulating Member)

Used as a heat insulating member 2 was one having a thickness of 30 mm in which graphite felt was coated with a carbon powder.

(Heater)

Used as a heater 3 was a graphite heater in a doughnut ring shape having an outer diameter of 360 mm and an inner diameter of 220 mm.

(Mold)

Prepared as the mold 4 was a mold having such a shape that a side plate 4b in the shape of four flat plates is raised upward from a peripheral edge of a square bottom plate 4a by combination with plate materials having a thickness of 2 mm composed of high-purity graphite, and having internal dimensions of 330 mm in length by 330 mm in breadth by 320 mm in depth, and having its bottom surface 4C measuring 334 mm in length by 334 mm in breadth. A mold release layer composed of a silicon nitride powder and a silicon dioxide powder was formed on an inner surface of the mold.

(Pedestal)

Used as the pedestal 5 was one having the shape of a rectangular parallelepiped having a placement surface 5a measuring 400 mm in length by 400 mm in breadth, and having a thickness D whose ratio to the stretch length L (=334 mm) of the bottom surface 4c of the mold 4 that is a contact region between the placement surface 5a of the pedestal 5 and the bottom surface 4c of the mold 4 placed thereon is as shown in Table 1. Although used as the pedestal 5 was basically one formed of graphite [a thermal conductivity of 49 W/(m·K)], pedestals 5 having the same size and shape and different thermal conductivity and formed of ceramics described below, in order to see the effect of the thermal conductivity of the pedestal 5:

Samples No. 1 to 5, 10 to 14: graphite [a thermal conductivity of 49 W/(m·K)]

Sample No. 6: 92% aluminum oxide [$Al_2O_3$, a thermal conductivity of 13 W/(m·K)]

Sample No. 7: silicon nitride [$Si_3N_4$, a thermal conductivity of 35 W/(m·K)]

Sample No. 8: sapphire [a thermal conductivity of 45 W/(m·K)]

Sample No. 9: aluminum nitride [AlN, a thermal conductivity of 84 W/(m·K)]

(Cooling Mechanism)

Figure 11B:
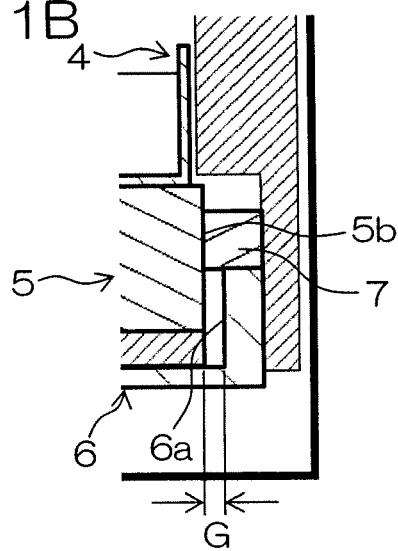
FIG. 11B is a vertical sectional view showing a change portion of the silicon casting apparatus manufactured in the example.

Used as a bottom cooling member 6 in a cooling mechanism C was one formed of stainless steel and having cooling water piping formed therein. Although used as the bottom cooling member 6 was basically one relatively movable in a plane direction of a side surface 5b of the pedestal 5 with a heat receiving surface 6a kept in contact with the side surface 5b, also used was one relatively movable in a plane direction of the side surface 5b of the pedestal 5 with the heat receiving surface 6a spaced a gap G shown in Table 1 apart from the side surface 5b, as shown in FIG. 11B, in order to also see an effect in spacing both the surfaces with a predetermined gap apart from each other.

(Movable Heat Insulating Piece)

Used as a movable heat insulating piece 7 was one composed of the same material as that composing the heat insulating member 2.

(Control Unit)

Used as control unit 11 was a programmable controller. The programmable controller was so configured that a temperature gradient in a silicon melt 8 within the mold 4 can be monitored by outputs of thermocouples 10 respectively provided at three points in the height direction of the mold 4.

(Up-And-Down Motor)

Used as an up-and-down motor 12 was a stepping motor capable of freely setting the amount of rise and fall of the bottom cooling member 6 depending on the amount of rotation thereof.

<<Production Test>>

A production test of silicon ingot was performed in the following procedure using the above-mentioned silicon casting apparatus.

First, the mold 4 was filled with a silicon raw material in a predetermined amount, and the inside of the apparatus was brought into an Ar gas atmosphere that had been depressurized to 10.7 KPa. The heater 3 was then energized and was heated to 1500° C. to melt the silicon raw material and form the silicon melt 8. The silicon melt 8 was subjected to unidirectional solidification by cooling the bottom surface side of the mold 4 through the pedestal 5 using the bottom cooling member 6 through which cooling water had been passed, to produce the silicon ingot.

<<Test of Temperature Follow-Up Properties>>

When the bottom cooling member 6 was raised by driving the up-and-down motor during the production of silicon ingot to increase the heat exchange area of a heat exchange region HE between the side surface 5b of the pedestal 5 and the heat receiving surface 6a of the bottom cooling member 6, a time period required for the change in the area to appear as the change in the temperature of the mold 4 measured by the thermocouples 10 was found, and temperature follow-up properties were evaluated on the following basis from the results thereof:

Excellent: Less than one minute. Excellent.

Good: More than one minute and less than five minutes. Good.

Fair: More than five minutes and less than ten minutes. Within an allowable range.

Bad: More than ten minutes. Bad.

<<Test of Reproducibility of Crystal Quality>>

The production of silicon ingot was repeatedly carried out five times under the same condition to produce five silicon ingots, and the minority carrier life time of each of the produced silicon ingots was measured by a photo conductive decay method (μ-PCD method) utilizing microwaves. A case in which all the minority carrier life times of the five silicon ingots were not less than 20 μsec was considered to be approved, and the reproducibility of crystal quality was evaluated on the following basis:

Excellent: The minority carrier life times of all the five silicon ingots were not less than 30 μsec. Excellent.

Good: The minority carrier life times of all the five silicon ingots were not less than 25 μsec and less than 30 μsec. Good.

Fair: The minority carrier life time of at least one of the silicon ingots was not less than 20 μsec and less than 25 μsec (the minority carrier life times of the other silicon ingots were more than 25 μsec). Within an allowable range.

Bad: The minority carrier life time of at least one of the silicon ingots was less than 20 μsec. Bad.

Figure 12A:
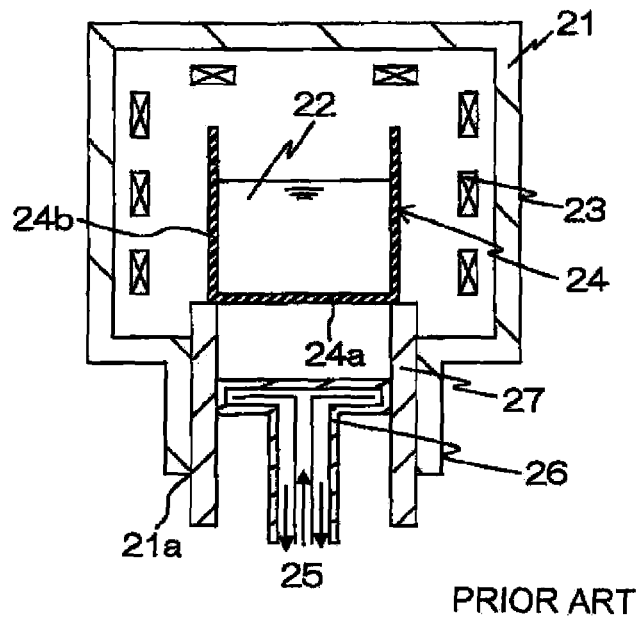
FIG. 12A is a vertical sectional view showing an example of a conventional silicon casting apparatus.
Figure 12B:
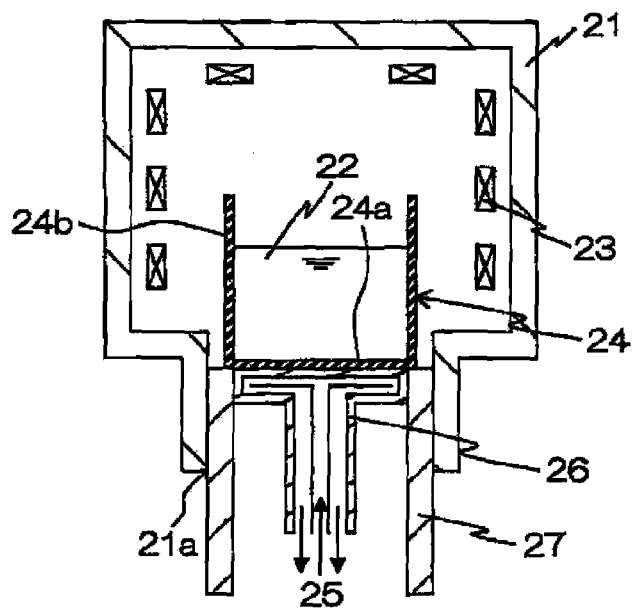
FIG. 12B is a vertical sectional view showing a conventional state where a mold in the silicon casting apparatus in the above example is lowered.
Figure 13:
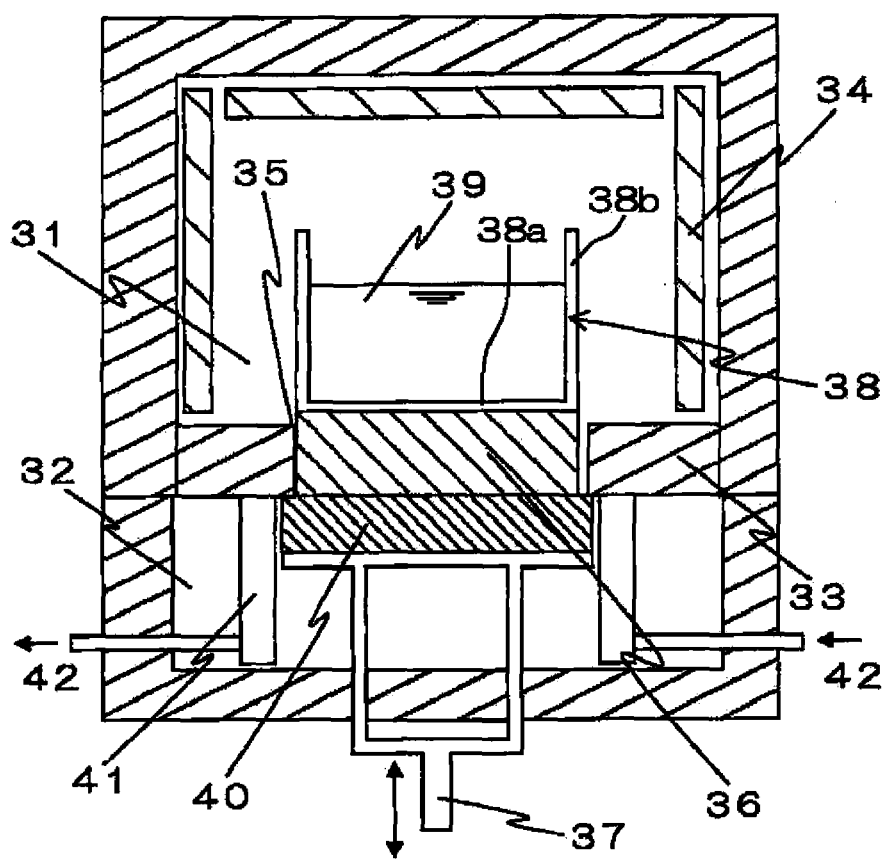
FIG. 13 is a vertical sectional view showing another example of the conventional silicon casting apparatus.

The above results, together with results in a case where a conventional silicon casting apparatus shown in FIGS. 12A and 12B was used, are shown in Table 1.

TABLE 1

| Sample No. | Apparatus | Bottom cooling member Heat exchange area | Gap G (mm) | Pedestal Thermal conductivity (W/mK) | D/L | Temperature follow-up properties | Reproducibility |
|---|---|---|---|---|---|---|---|
| 1 | FIG. 11A | Variable | 0 | 49 | 0.2 | Good | Good |
| 2 | FIG. 11B | Variable | 4 | 49 | 0.2 | Good | Good |
| 3 | FIG. 11B | Variable | 8 | 49 | 0.2 | Fair | Good |
| 4 | FIG. 11B | Variable | 12 | 49 | 0.2 | Fair | Fair |
| 5 | FIG. 11B | Variable | 16 | 49 | 0.2 | Fair | Fair |
| 6 | FIG. 11A | Variable | 0 | 13 | 0.2 | Fair | Fair |
| 7 | FIG. 11A | Variable | 0 | 35 | 0.2 | Fair | Good |
| 8 | FIG. 11A | Variable | 0 | 45 | 0.2 | Good | Good |
| 9 | FIG. 11A | Variable | 0 | 84 | 0.2 | Excellent | Good |
| 10 | FIG. 11A | Variable | 0 | 49 | 0.1 | Good | Fair |
| 11 | FIG. 11A | Variable | 0 | 49 | 0.15 | Good | Fair |
| 12 | FIG. 11A | Variable | 0 | 49 | 0.18 | Good | Good |
| 13 | FIG. 11A | Variable | 0 | 49 | 0.3 | Good | Excellent |
| 14 | FIGS. 12A, 12B | Constant | 0 | 49 | 0.3 | — | Bad |

From Table, in the sample 14 using the conventional silicon casting apparatus, the heat exchange area was constant and the temperature gradient in the silicon melt within the mold could not be controlled, so that the reproducibility of crystal quality was poor. Conversely, in the samples 1 to 13 using the silicon casting apparatus according to the present invention, both the temperature follow-up properties and the reproducibility of crystal quality were not less than the allowable range, so that the effect of the present invention was recognized.

The invention claimed is:

1. A silicon casting apparatus comprising:
   a mold for holding a silicon melt therein and cooling and solidifying the silicon melt to produce silicon ingot;
   a heating mechanism for heating the silicon melt and disposed within a constant distance above the mold; and
   a cooling mechanism disposed below the heating mechanism for cooling the silicon melt, characterized in that
   the cooling mechanism comprises a cooling member for cooling an outer surface of the mold,
   the cooling member having a heat receiving surface brought into direct contact with a heat radiation surface, said radiation surface being one of
   (i) the outer surface of the mold, or
   (ii) a surface, of a heat transfer member comprising a contact surface
   arranged in close proximity to the mold with a predetermined gap between the heat transfer member and the mold,
   said cooling member movable relative to the mold or the heat transfer member in order to change a heat exchange area, brought into contact with or arranged in close proximity to the heat radiation surface, of the heat receiving surface.

2. The silicon casting apparatus according to claim 1, wherein the cooling member comprises a bottom cooling member for cooling a bottom surface of the mold, the bottom cooling member having a heat receiving surface brought into direct contact with a heat radiation surface that is
   (1) the bottom surface of the mold, or
   (2) a surface of a pedestal serving as said heat transfer member comprising a placement surface
   arranged in close proximity to the mold with a predetermined gap between the heat transfer member and the mold,
   said bottom cooling member movable relative to the mold or the pedestal in order to change the heat exchange area, brought into contact with or arranged in close proximity to the heat radiation surface, of the heat receiving surface.

3. The silicon casting apparatus according to claim 2, wherein the bottom cooling member is moved in a plane direction of the heat radiation surface relative to the mold or the pedestal while maintaining a state where the heat receiving surface thereof is kept in direct contact with the heat radiation surface.

4. The silicon casting apparatus according to claim 2, wherein the bottom cooling member is moved in a plane direction of the heat radiation surface relative to the mold or the pedestal while maintaining a state where the heat receiving surface thereof is arranged in close proximity to the heat radiation surface with a predetermined gap.

5. The silicon casting apparatus according to claim 4, wherein the gap between the heat radiation surface and the heat receiving surface is not more than 10 mm.

6. The silicon casting apparatus according to claim 2, wherein a thermal conductivity of the pedestal is not less than 40 W/(m·K).

7. The silicon casting apparatus according to claim 6, wherein the pedestal has one surface serving as the placement surface, a surface opposite to the placement surface being parallel to the placement surface, and is formed in the shape of a plate having a constant thickness, and the thickness is not less than one-sixth of a stretch length of a contact region between the placement surface and the bottom surface of the mold placed on the placement surface.

8. The silicon casting apparatus according to claim 1, wherein the mold comprises a bottom plate and a side plate raised upward from a peripheral edge of the bottom plate, and the cooling member comprises a bottom cooling member for cooling a bottom surface that is a lower surface of the bottom plate of the mold, and a side cooling member for cooling a side surface that is an outer side surface of the side plate of the mold, the side cooling member having a heat receiving surface brought into direct contact with the side surface of the mold or arranged in close proximity thereto with a predetermined gap, and being moved relative to the mold in order to change the heat exchange area, brought into contact with or arranged in close proximity to the side surface of the mold, of the heat receiving surface.

9. The silicon casting apparatus according to claim 8, wherein the side cooling member is moved in a height direction of the mold relative to the mold while maintaining a state where the heat receiving surface is kept in direct contact with the side surface of the mold.

10. The silicon casting apparatus according to claim 8, wherein the side cooling member comprises a plurality of cooling members respectively having divisional heat receiving surfaces into which the heat receiving surface is divided in the height direction of the mold, each of the cooling members being relatively moved individually between a state where the divisional heat receiving surface is in direct contact with the side surface of the mold or arranged in close proximity thereto with a predetermined gap and a state where they are spaced apart from each other.

11. The silicon casting apparatus according to claim 8, wherein the bottom cooling member has a heat receiving surface brought into direct contact with said heat radiation surface.

12. The silicon casting apparatus according to claim 11, wherein the bottom cooling member comprises a plurality of cooling members respectively having divisional heat receiving surfaces into which the heat receiving surface is divided at a center and a peripheral edge of the bottom surface of the mold, each of the cooling members being relatively moved individually between a state where the divisional heat receiving surface is in direct contact with the heat radiation surface or arranged in close proximity thereto with a predetermined gap and a state where they are spaced apart from each other.

13. The silicon casting apparatus according to claim 1, comprising
   temperature detection unit for measuring a temperature of the mold, and
   control unit for controlling a state of heating by the heating mechanism and a position of the cooling member relative to the mold on the basis of the temperature of the mold measured by the temperature detection unit.

14. The silicon casting apparatus according to claim 1, comprising inert gas discharge unit, with a distance from the mold and the heating mechanism kept constant, for spraying inert gas on the silicon melt held inside the mold.

15. A method of producing silicon ingot using the silicon casting apparatus according to claim 1, characterized by comprising the steps of: holding a silicon melt inside a mold; and subjecting the silicon melt to unidirectional solidification from a lower part to an upper part of the mold by cooling the silicon melt from below of the mold by a cooling mechanism while heating the silicon melt by a heating mechanism disposed above the mold with a predetermined distance maintained therebetween as well as moving the cooling mechanism relative to the mold as a solid-liquid interface of the silicon melt rises clue to cooling.

16. The method of producing silicon ingot according to claim 15, wherein the silicon casting apparatus comprises temperature detection unit and control unit, the control unit subjecting the silicon melt to unidirectional solidification from a lower part to an upper part of the mold while controlling a state of heating by the heating mechanism and a position of the cooling member relative to the mold on the basis of a temperature of the mold measured by the temperature detection unit.

17. The method of producing silicon ingot according to claim 15, wherein the silicon casting apparatus comprises inert gas discharge unit, for subjecting the silicon melt held inside the mold to unidirectional solidification from a lower part to an upper part of the mold while spraying inert gas from the inert gas discharge unit on the silicon melt.

* * * * *